(12) United States Patent
Ichihara et al.

(10) Patent No.: US 7,183,586 B2
(45) Date of Patent: Feb. 27, 2007

(54) SEMICONDUCTOR ELEMENT AND MANUFACTURING METHOD FOR THE SAME

(75) Inventors: Takashi Ichihara, Tokushima (JP); Daisuke Sanga, Tokushima (JP); Takeshi Kususe, Tokushima (JP); Takao Yamada, Komatsushima (JP)

(73) Assignee: Nichia Corporation, Tokushima (JP)

( * ) Notice: Subject to any disclaimer, the term of this patent is extended or adjusted under 35 U.S.C. 154(b) by 245 days.

(21) Appl. No.: 10/989,657

(22) Filed: Nov. 17, 2004

(65) Prior Publication Data

US 2005/0104080 A1    May 19, 2005

(51) Int. Cl.
*H01L 29/22* (2006.01)
(52) U.S. Cl. .......................................... 257/98; 257/95
(58) Field of Classification Search .................. 257/98, 257/99, 95
See application file for complete search history.

(56) References Cited

U.S. PATENT DOCUMENTS 6,420,735 B2 * 7/2002 Kim ............................ 257/95

FOREIGN PATENT DOCUMENTS

| JP | 3-138893 | 6/1991 |
| JP | 10-270754 | 10/1998 |
| JP | 2000-196152 | 7/2000 |
| JP | 2002-246648 | 8/2002 |
| JP | 2002-344019 | 11/2002 |

* cited by examiner

*Primary Examiner*—Mark V. Prenty
(74) *Attorney, Agent, or Firm*—Wenderoth, Lind & Ponack, L.L.P.

(57) ABSTRACT

A nitride semiconductor light emitting element is provided with: a substrate 11 having a pair of main surfaces that face each other; a nitride semiconductor layer of a first conductivity type layered on one of the main surfaces of substrate 11; a nitride semiconductor layer of a second conductivity type layered on the nitride semiconductor layer of the first conductivity type; an active layer 14 formed between the nitride semiconductor layer of the first conductivity type and the nitride semiconductor layer of the second conductivity type; and a reflective layer 16 formed on the nitride semiconductor layer of the second conductivity type for reflecting light from active layer 14 toward the nitride semiconductor layer of the second conductivity type. This nitride semiconductor light emitting element can be mounted on a circuit board, with the other main surface of the above described substrate 11 being used as the main light emitting surface. Furthermore, a translucent conductive layer 17 is formed between reflective layer 16 and the nitride semiconductor layer of the second conductivity type, and an uneven interface 22 is formed as the interface between translucent conductive layer 17 and reflective layer 16.

20 Claims, 8 Drawing Sheets

(a)

(b)

SEMICONDUCTOR ELEMENT AND MANUFACTURING METHOD FOR THE SAME

BACKGROUND OF THE INVENTION

1. Field of the Invention

The present invention relates to a nitride semiconductor element formed of a semiconductor layer where a nitride semiconductor made of $Al_xIn_yGa_{1-x-y}N$ ($0 \leq x$, $0 \leq y$, $0 \leq x+y<1$) is layered, and to a manufacturing method for the same, and in particular, to a semiconductor light emitting element such as a light emitting diode (LED) or a laser of which the light emitting efficiency is improved, as well as to a manufacturing method for the same.

2. Description of the Related Art

A light emitting element using a nitride-based semiconductor such as gallium nitride makes light emission of ultraviolet light, blue light, green light and the like possible with high efficiency and low consumed power, and makes miniaturization possible, increasing the strength against mechanical vibration and the like, with the advantage of long lifespan, high reliability and the like, and therefore, is widely applicable to a variety of fields. In particular, applicability of a light emitting element to a large size display, a traffic signal, the backlight source of a cellular phone and the like has significantly become widespread.

It is important, in a light emitting element using a nitride-based semiconductor, to enhance the light emitting efficiency so that light generated in the active layer can be emitted to the outside for effective use. From such a point of view, a conductive film having translucency is required as an electrode, and ITO (compound oxide of In and Sn), $SnO_2$, ZnO, for example, are utilized. In particular, ITO is an oxide conductive material where indium oxide contains tin and has a low resistance and a high translucency, and therefore, is appropriate for a translucent electrode and the like.

FIG. 1 shows an example of an LED utilizing such a translucent electrode. The LED has a structure where an n-type GaN layer 2, an InGaN light emitting layer 3 and p-type GaN layer 4 are epitaxially grown in sequence on a sapphire substrate 1 via a buffer layer. In addition, portions of InGaN light emitting layer 3 and p-type GaN layer 4 are selectively etched and removed so as to expose n-type GaN layer 2. An ITO layer is formed on p-type GaN layer 3 as a p-type translucent electrode 5, and a bonding pad of a p-side electrode 7 is further layered on top of this. In addition, an n-side electrode 8 is formed on n-type GaN layer 2. These electrodes are formed by depositing metal such as Al, Au, In or the like. In such a structure, a current that has been injected via p-side electrode 7 is uniformly diffused in the ITO layer, which is p-side translucent electrode 5 having high conductivity, so that the current can be injected from p-type GaN layer 3 to n-type GaN layer 2 so as to emit light. In addition, this light is not blocked by p-side electrode 7, but rather, is transmitted through the ITO layer so as to be emitted to the outside of the chip.

However, such a nitride-based semiconductor light emitting element has a problem with high contact resistance in the electrode portions. This is because the band gap of GaN is as wide as 3.4 eV, making ohmic contact with the electrodes difficult. As a result of this, the contact resistance of the electrode portions becomes high, enhancing the operation voltage of the element, which causes the problem of high consumed power and large amount of heat emission.

On the other hand, light emitting efficiency is also poor. This is because the index of refraction of GaN is as great as approximately 2.67, and therefore, the critical angle is 21.9 degrees, which is extremely small. That is to say, light that has entered at an angle greater than this critical angle relative to the normal line to the main light emitting surface cannot be emitted to the outside of the LED chip, but rather, is confined therein. As a result of this, it is difficult to improve the external quantum efficiency and gain a greater light emitting power.

Here, in the case where the surface of the p-type GaN layer, which is the main light emitting surface, is processed so as to have an uneven form, the above described problem can be dealt with. However, it becomes necessary for the p-type GaN layer to have a certain thickness, in order to create the uneven form. Also, in the case where a thick p-type GaN layer is formed while doping an impurity with high concentration in order to reduce as much as possible the contact resistance with the electrode, a new problem arises, wherein surface coarseness of the crystal surface occurs.

Japanese Unexamined Patent Publication No. 2000-196152 discloses an LED element where the light emitting efficiency has been improved by providing unevenness on the main light emitting surface in order to solve the above described problem. In the LED disclosed in Japanese Unexamined. Patent Publication No. 2000-196152, the interface between the ITO layer, which is a translucent electrode, and the p-type GaN layer, which is: a p-type semiconductor layer, is made uneven so as to provide the configuration that makes it easy for the light reflected from this interface to be emitted to the outside, improving the emitting efficiency. Concretely speaking, the surface of the p-type GaN layer is processed so as to be uneven, and a translucent metal electrode or a translucent electrode is provided on top of this.

However, in the case where the surface of a GaN layer is processed so as to be uneven, a problem arises wherein the epitaxial growth layer is damaged in a manner where this portion cannot emit light. In addition, when the p-type GaN layer is too thin, it allows the process for forming the unevenness to damage the active layer and the n-type GaN layer, and therefore, the GaN layer must be a thick film, in order to avoid such a problem. On the other hand, though there is a method where the surface of the p-type GaN layer is made to be flat and the surface of the p-side translucent electrode is processed so as to be uneven, it makes the uneven surface too close to the main light emitting surface, making this uneven pattern visible easily from the outside, and the problem of poor appearance arises.

In addition, in a so-called face-up structure where a p-type electrode is provided on the main light emitting surface, it becomes necessary to provide an n-type electrode, making the main light emitting surface smaller, and in addition, it is necessary for a pad electrode to be provided on the p-type electrode, causing light to be blocked by this portion, which prevents light emission, and the problem of poor light emitting efficiency arises.

In addition, in the structure where a conductive oxide film represented by ITO is used as a translucent conductive layer, it is necessary to increase translucency, and furthermore, in the structure where the conductive oxide film is provided so as to make contact with a semiconductor layer, it is also necessary to enhance ohmic properties. However, it is difficult to increase translucency and enhance ohmic properties at the same time, and a further increase in the performance of the conductive oxide film is required.

SUMMARY OF THE INVENTION

The present invention is provided in order to solve such problems. A main object of the present invention is to provide a semiconductor light emitting element having a high reflection efficiency, and a manufacturing method for the same, and in particular, to provide a semiconductor light emitting element having a high light emitting efficiency, and a manufacturing method for the same.

In order to achieve the above described object, a semiconductor element according to the present invention is provided with: a substrate 11 having a pair of main surfaces that face each other; a semiconductor layer of a first conductivity type on one of the main surfaces of the above described substrate 11; a semiconductor layer of a second conductivity type on the above described semiconductor layer of the first conductivity type; an active layer 14 formed between the above described semiconductor layer of the first conductivity type and the above described semiconductor layer of the second conductivity type; and a reflective layer 16 formed on the above described semiconductor layer of the second conductivity type for reflecting light from the above described active layer 14 toward the above described semiconductor layer of the second conductivity type. This semiconductor element can be mounted on a circuit board as a light emitting element, with the other main surface of the above described substrate 11 being used as the main light emitting surface. Furthermore, a translucent conductive layer 17 is formed between the above described reflective layer 16 and the semiconductor layer of the second conductivity type, and an uneven interface 22 is formed as the interface between the above described translucent conductive layer 17 and the above described reflective layer 16. In this configuration, light emitted from active layer 14 to the semiconductor layer of the second conductivity type is reflected from uneven interface 22 so as to be scattered, enhancing the light emitting efficiency to the outside. In particular, unevenness is formed in the interface between translucent conductive layer 17 and the above described reflective layer 16, and therefore, the problem of difficulty in processing the surface of the semiconductor layer of the second conductivity type without deteriorating the properties thereof is solved.

In addition, the interface between the above described translucent conductive layer 17 and the above described semiconductor layer of the second conductivity type can be made to be an approximately flat and smooth surface in the semiconductor light emitting element. In this configuration, unevenness is formed in the interface between translucent conductive layer 17 and the above described reflective layer 16 without processing the surface of the semiconductor layer of the second conductivity type, so that the light emitting efficiency can be improved.

Furthermore, the above described uneven surface 22 of the semiconductor element, which is a semiconductor light emitting element, is provided with inclined surfaces of which the angle of inclination can be made to be not greater than 60° relative to the normal line to the main light emitting surface. This configuration can increase the probability of light being reflected at an angle not greater than the critical angle, improving the light emitting efficiency.

Furthermore, the above described uneven surface 22 of the semiconductor element, which is a semiconductor light emitting element, can be in the form of continuous cylindrical lenses. This configuration reduces portions of the surface which are parallel to the interface, increasing the probability of light being reflected at an angle that is not greater than the critical angle, and thus, the light emitting efficiency can be improved.

Moreover, a layer made of an oxide that includes at least one of element C selected from a group consisting of Zn, In, Sn and Mg can be used for the above described translucent conductive layer 17 of the semiconductor element, which is a semiconductor light emitting element. In addition, a layer that includes a trace element D in addition to element C can be used for the above described oxide film. In addition, the trace element D can be at least one of element selected from among tin, zinc, gallium and aluminum. Preferable, the configuration can be made of ITO, wherein indium is used as element C and tin is used as the trace element D. In this configuration, ITO where a fine pattern is easily formed is used for translucent conductive layer 17 of which the surface can be processed to uneven interface 22, increasing the light emitting efficiency in addition, ITO is excellent for an ohmic connection to a nitride semiconductor layer, and therefore, it allows the nitride semiconductor light emitting element to have a low contact resistance in the interface between the transparent conductive layer and the nitride semiconductor layer of the second conductivity type, so that a practical nitride semiconductor light emitting element having a low voltage Vf in the forward direction can be implemented.

In addition, a semiconductor element can be provided, wherein the concentration of the trace element D in the vicinity of the interface between the semiconductor layer and the oxide film that includes element C and the trace element D is higher than that of the trace element D in the other portion of the film in the oxide film. In addition, a semiconductor element can be provided, wherein the concentration of the trace element D in the vicinity of the interface between the semiconductor layer and the oxide film that includes element C and the trace element D is higher than that of the trace element D in the vicinity of the surface opposite from the interface. In this configuration, in the case of, for example, ITO, more carriers can be placed on the semiconductor layer side than that that uniformly includes the trace element D in the oxide film, and thereby, the Schottky barrier can be lowered and the sheet resistance on the semiconductor layer side can be reduced so that a high quality semiconductor light emitting element where an improvement in the light emitting efficiency and a reduction in the sheet resistance are simultaneously achieved can be implemented. In addition, it is preferable for the above described oxide film to include element D of which the amount is not greater than 20% of the amount of element C.

Moreover, the above described reflective layer 16 of the nitride semiconductor light emitting element can be a layer that includes at least one of element selected from among aluminum, titanium, platinum, rhodium, silver, palladium, iridium, silicon and zinc. In particular, it is preferable for the layer to include aluminum (Al), rhodium (Rh) or silver (Ag) in order to be a layer that can implement a high reflection used in the nitride semiconductor light emitting element of the present invention. Light can be efficiently reflected from the interface between the reflective layer and translucent conductive layer 17, enhancing the light emitting efficiency, due to the high reflectance of aluminum, rhodium or silver in the reflective layer.

Moreover, the above described reflective layer 16 of the nitride semiconductor light emitting element may be made of a dielectric that includes at least any of Si, Zn, Ti, Zr, Hf, Nb, Ta, Al and Mg. It is more preferable to use a dielectric multilayered film wherein two types of dielectrics are selected from among $SiO_2$, $TiO_2$, $ZrO_2$, $HfO_2$, $Nb_2O_3$, Al$_2$O$_3$ and the like so that the combination thereof is that of a low index of refraction and a high index of refraction with a large difference in the index of refraction, and are multi-layered, or it is preferable to use SiO$_2$, MgO, MgF, Al$_2$O$_3$, SiN, SiON or the like. In this configuration, adhesion between reflective layer 16 and translucent conductive layer 17 can be increased. In particular, in the case where ITO is utilized for translucent conductive layer 17, reflective layer 16 made of a dielectric, instead of metal such as Al, can provide higher adhesiveness in the interface, enhancing reliability.

Moreover, the film thickness of the above described translucent conductive layer 17 may be approximately integer times of λ/4, wherein the wavelength of light emitted from the above described active layer 14 is λ, in the nitride semiconductor light emitting element.

Moreover, the film thickness of the above described translucent conductive layer 17 can be not greater than 2 μm in the nitride semiconductor light emitting element.

Furthermore, the above described reflective layer 16 may also be formed in planes that cross the main surfaces of substrate 11 in the nitride semiconductor light emitting element. This structure makes light that has been emitted in the lateral direction be reflected toward the upper surface, making it possible to emit a great amount of light.

Moreover, at least a portion of the surface of the above described nitride semiconductor layer that crosses the main surfaces of the above described substrate 11 is inclined in the nitride semiconductor light emitting element. This configuration makes light that has been emitted in the lateral direction be reflected in the upward direction, further increasing the light emitting efficiency.

In addition, a manufacturing method for a nitride semiconductor light emitting element of the present invention is a manufacturing method for a semiconductor element provided with; a substrate 11 having a pair of main surfaces that face each other; a semiconductor layer of a first conductivity type on one of the main surfaces of the above described substrate 11; a semiconductor layer of a second conductivity type on the above described semiconductor layer of the first conductivity type; an active layer 14 formed between the above described semiconductor layer of the first conductivity type and the semiconductor layer of the second conductivity type; and a reflective layer 16 formed on the above described semiconductor layer of the second conductivity type for reflecting light from the above described active layer 14 toward the above described semiconductor layer of the second conductivity type, which can be mounted on a circuit board as a light emitting element, with the other main surface of the above described substrate 11 being used as the main light emitting surface. This method is provided with: the step of layering a semiconductor layer of a first conductivity type, an active layer 14 and a semiconductor layer of a second conductivity type on a substrate 11; the step of forming a translucent conductive layer 17 on the above described semiconductor layer of the second conductivity type the step of forming an uneven surface 22 on the above described translucent conductive layer 17; and the step of forming a reflective layer 16 on translucent conductive layer 17, on which the above described uneven surface 22 has been formed. As a result of this, light that has been emitted from active layer 14 to the semiconductor layer of the second conductivity type can be reflected from uneven interface 22 so as to be scattered, increasing the light emitting efficiency to the outside. In particular, the unevenness is formed in the interface between translucent conductive layer 17 and the above described reflective layer 16, and therefore, the problem of difficulty with processing the surface of the semiconductor layer of the second conductivity without deteriorating the properties thereof is solved.

According to a semiconductor element and a manufacturing method for the same of the present invention, the light emitting efficiency to the outside can be greatly increased without damaging the nitride semiconductor which is difficult to process without deteriorating the properties. This is because, according to the present invention, a reflective film is formed on the translucent conductive layer having an uneven surface, and this interface is used as a reflecting surface having unevenness, so that the majority of the reflected light is made to enter the main light emitting surface that faces the reflective part at an angle not greater than the critical angle so as to greatly increase the amount of light emission to the outside. In addition, the translucent conductive layer intervenes between the nitride semiconductor layer of the second conductivity type and the reflective layer, providing advantages wherein the above described uneven surface is easily processed, and in addition, ohmic contact can be easily gained. In particular, though it is difficult to cause ohmic contact between a nitride semiconductor and a metal, it is made easy to cause ohmic contact by making a translucent conductive layer made of ITO or a dielectric intervene, thus providing the advantage where the contact resistance is reduced in this manner, lowering the operation voltage, and thereby, a nitride semiconductor light emitting element having a low consumed power and a small amount of heat emission can be implemented.

In addition, a conductive oxide film which is used as a translucent conductive film is provided in the structure of the present invention, and thereby, a semiconductor element, in particular, a semiconductor light emitting element which is a high quality semiconductor light emitting element where the light emitting efficiency is: increased and the sheet resistance is simultaneously reduced can be implemented.

DETAILED DESCRIPTION OF THE PREFERRED EMBODIMENTS

In the following, the embodiments of the present invention are described in reference to the drawings. Here, the embodiments described in the following illustrate semiconductor elements and manufacturing methods for the same, which are needed in order to implement the technical idea of the present invention, and the semiconductor elements and the manufacturing methods for the same according to the present invention are not limited to the following.

In addition, the members shown in the claims are by no means limited to the members of the embodiments in the present specification. In particular, the dimensions, the materials, the forms and relative positions of the constitutional parts described in the embodiments are not intended to limit the scope of the present invention, but rather, merely illustrate examples, unless otherwise stated. Here, the sizes and positional relationships of the members shown in the respective drawings may be exaggerated for the sake of clarity. Furthermore, the same names and symbols indicate the same members or members having the same qualities in the following description, and detailed descriptions thereof are therefore omitted. Furthermore, concerning the respective elements that form the present invention, a plurality of elements may be formed of the same member so that one member is used as the plurality of elements in one mode, or conversely, the present invention can be implemented in a manner where the functions of one member are carried out by the plurality of members in another mode.

Embodiment 1

Figure 1:
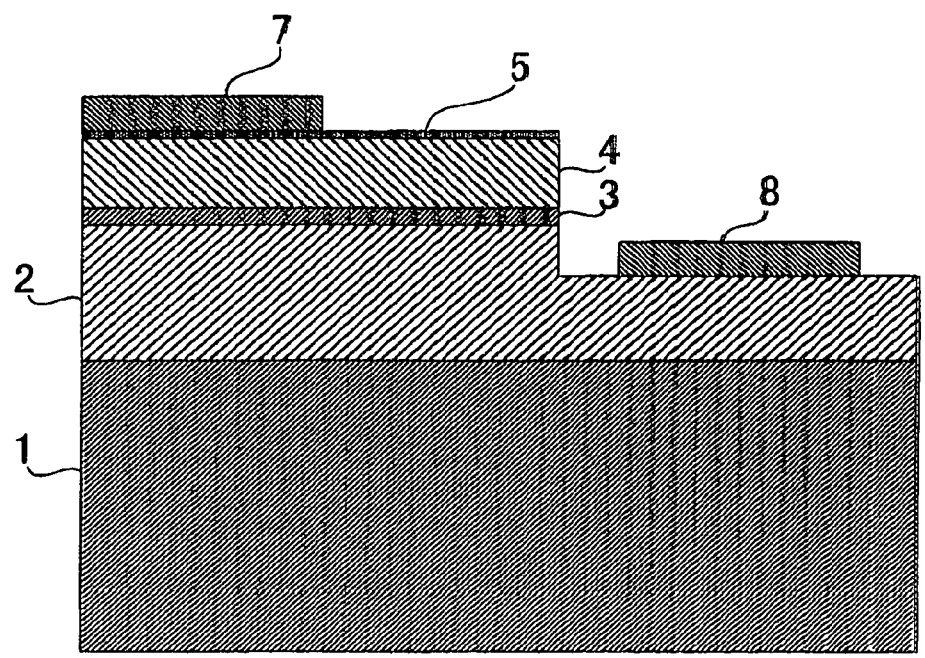
FIG. 1 is a schematic cross-sectional diagram showing an example of an LED utilizing a translucent electrode according to the prior art.
Figure 2:
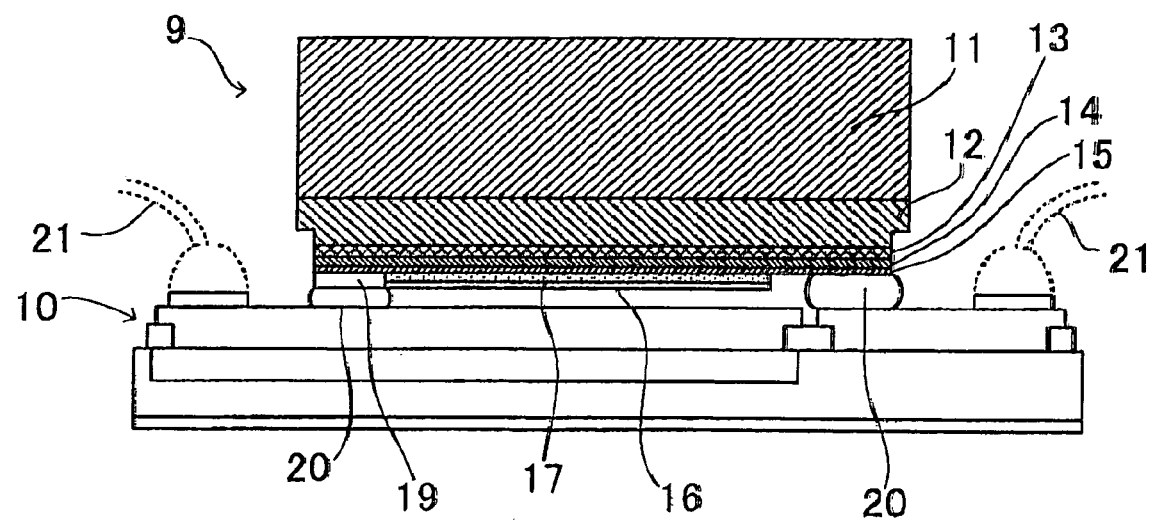
FIG. 2 is a schematic cross-sectional diagram showing an LED on which a nitride semiconductor light emitting element according to one embodiment of the present invention is mounted.

An example on which a nitride semiconductor light emitting element according to one embodiment of the present invention is mounted is shown in the schematic cross-sectional diagram of FIG. 2. In this figure, an LED chip 9, which is a nitride semiconductor light emitting element, is mounted on a sub-mount 10, which is one type of circuit board, as a flip chip. A flip chip is used in a mounting system, which is referred to as face-down mounting, where the substrate 11 side that faces the surface on which the electrodes are formed is used as the main light emitting surface, unlike face-up mounting, where the surface on which the electrodes of the nitrite semiconductor layer acre formed is used as the main light emitting surface.

In an LED chip 9 of FIG. 2, a buffer layer 12, an n-type nitride semiconductor layer 13, an active layer 14 and a p-type nitride semiconductor layer 15 are epitaxially grown in sequence on a substrate 11, and furthermore, a translucent conductive layer 17 and a reflective layer 16 are layered on top of this. As a crystal growth method, for example, a metal-organic chemical vapor deposition (MOCVD) method, a hydride vapor phase epitaxy (HVPE) method, a hydride CVD method, an MBE (molecular bean epitaxy) and the like can be utilized. In addition, as the layered structure of the semiconductor layer, a homogeneous structure, a hetero-structure or a double hetero-structure having an MIS junction, a PN junction or a PN junction can be cited. In addition, each layer can be made to have a super-lattice structure, or a single quantum well structure or a multiple quantum well structure can be provided, wherein active layer 14 is formed so as to be a thin film, allowing the occurrence of a quantum effect.

In addition, though not shown in detail in FIG. 2, portions of active layer 14 and p-type nitride semiconductor layer 15 are selectively etched and removed so as to expose a portion of n-type nitride semiconductor layer 15, where an n-side pad electrode 18 is formed. In addition, a p-side pad electrode 19 is formed on p-type nitride semiconductor layer 15, on the same surface side as the n-side electrode. Metalized layers (bumps 20) are formed on the pad electrodes for the connection with external electrodes or the like. The metalized layers are made of a material such as Ag, Au, Sn, In, Bi, Cu or Zn. The electrode-formed surface side of such an LED chip 9 is made to face a pair of positive and negative external electrodes provided on sub-mount 10 so that the respective electrodes are joined by means of bumps 20. Furthermore, wires 21 or the like are connected to sub-mount 10. On the other hand, the main surface side of substrate 11 of LED chip 9 which has been mounted in a face down position is used as the main light emitting surface.

Here, in the present specification, "on" as in "on a layer" is not necessarily limited to the case where something is formed on an upper surface making contact with it, but rather, may indicate the case where something is formed above the layer, including the case where an intervening layer exists between layers.

Figure 3:
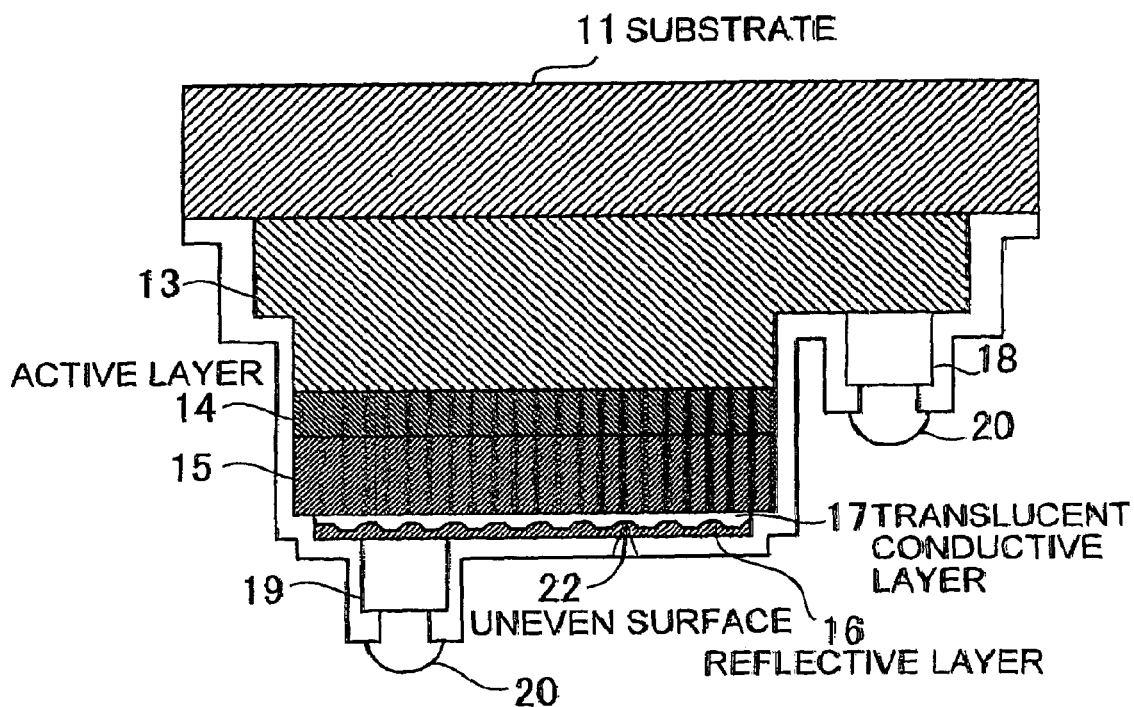
FIG. 3 is a schematic cross-sectional diagram showing a nitride semiconductor light emitting element according to the first embodiment of the present invention.

FIG. 3 shows the nitride semiconductor light emitting element according to the first embodiment of the present invention in further detail. The nitride semiconductor light emitting element is shown upside down in the figure, indicating that it has been mounted as a flip chip. In the actual manufacturing process, the respective layers are formed on substrate 11, and the resulting nitride semiconductor light emitting element is turned upside down so as to be mounted as shown in FIG. 2.

[Substrate 11]

Substrate 11 is a translucent substrate on which a nitride semiconductor can be epitaxially grown, and the size, the thickness and the like of the substrate are not particularly limited. As this substrate, an insulating substrate such as sapphire or spinel ($MgAl_2O_4$) having any of C surface, R surface and A surface as the main surface, or an oxide substrate such as lithium niobate or gallium neodymium, which lattice-joins silicon carbide (6H, 4H, 3C), silicon, ZnS, ZnO, Si, GaAs, diamond and a nitride semiconductor can be cited. In addition, a nitride semiconductor substrate such as GaN or AlN can be used, as long as it has a film thickness (not less than several tens of μm) that makes device processing possible. A heterogeneous substrate may have an off angle which ranges from 0.01° to 3.0° preferably from 0.05° to 0.5° in the case when a C surface of sapphire is used. In addition, when a material such as sapphire, which is different from a nitride semiconductor, is used for the substrate, a nitride semiconductor may be epitaxially grown on the substrate after unevenness is formed on the substrate. As a result of this, the amount of light that is reflected from the interface between the nitride semiconductor layer and the heterogeneous substrate can be reduced, and in addition, the light that is reflected from the interface is also emitted from the substrate side, which is preferable. The height of the bumps of this unevenness should at least be greater than the wavelength of the light from the light emitting layer, and should allow the light emitting layer to have a flat surface after the light emitting layer has been grown.

[Nitride Semiconductor Layer]

The nitride semiconductor has a general formula $In_x Al_y Ga_{1-x-y} N$ ($0 \leq x$, $0 \leq y$, $x+y \leq 1$) where B, P or As may be mixed in the crystal. In addition, n-type nitride semiconductor layer 13 and p-type nitride semiconductor layer 15 may be single-layered or multilayered. In addition, the nitride semiconductor layers contain an appropriate amount of an n-type impurity or p-type impurity. A IV group or VI group element, such is Si, Ge, Sn, S, O, Ti or Zr can be used as the n-type impurity, preferably, Si, Ge or Sn is used, and more preferable, Si is used. In addition, the p-type impurity is not particularly limited, and Be, Zn, Mn, Cr, Mg and Ca can be cited, and preferably, Mg is used. As a result of this, the nitride semiconductors of the respective conductivity types can be formed. The above described nitride semiconductor layers have an active layer 14, which has a single (SQW) or multiple quantum well structure (MQW). In the following, the nitride semiconductors are described. I detail.

The nitride semiconductor grown on substrate 11 has an intervening a buffer layer (not shown in FIG. 3). As the buffer layer, a nitride semiconductor represented by the general formula $Al_a Ga_{1-a} N$ is used, and more preferably, a nitride semiconductor represented by the general formula $Al_a Ga_{1-a} N$ ($0 \leq a \leq 0.5$) is used. The film thickness of the buffer layer is preferably 0.002 μm to 0.5 μm, more preferably 0.005 μm to 0.2 μm, and most preferably 0.01 μm to 0.02 μm. The growth temperature of the buffer layer is preferably 200° C. to 900° C., and more preferably 400° C. to 800° C. As a result of this, dislocations and pits can be reduced in the nitride semiconductor layers. Furthermore, an $Al_x Ga_{1-x} N$ ($0 \leq x \leq 1$) layer may be grown on the above described heterogeneous substrate according to an ELO (epitaxial lateral overgrowth) method. According to the ELO (epitaxial lateral overgrowth) method, a nitride semiconductor is grown in the lateral direction so as to converge penetrating dislocations by banding them, and thereby, the dislocations can be reduced. The buffer layer may have a multilayered structure where a buffer layer is grown at a low temperature, and another layer is grown and formed on top of this at a high temperature. As the layer grown at a high temperature, undoped GaN or GaN into which an n-type impurity has been doped can be used. The thickness of the layer grown at a high temperature may be not less than 1 μm, and preferably not less than 3 μm. In addition, the layer grown at a high temperature is grown at a temperature of 900° C. to 1100° C., preferably at a temperature not lower than 1050° C.

Next, n-type nitride semiconductor layer 13 is grown. First, an n-type contact layer (not shown) is grown. As the n-type contact layer, which has a composition of which the band gap energy is greater than that of active layer 14, $Al_j Ga_{1-j} N$ ($0<j<0.3$) is preferable. The film thickness of the n-type contact layer is not particularly limited, and prefer- ably, it is not less than 1 μm, and more preferably, it is not less than 3 μm. Next, an n-type clad layer is grown. The n-type clad layer contains Al of which the n-type impurity concentration is not particularly limited, and is preferably $1 \times 10^{17}/cm^3$ to $1 \times 10^{20}/cm^3$, more preferably $1 \times 10^{18}/cm^3$ to $1 \times 10^{19}/cm^3$. In addition, the n-type impurity concentration may have an inclination. In addition, the concentration of Al in the composition may have an inclination, so that the layer functions as a clad layer for confining carriers.

Active layer 14 functions as a light emitting layer, and has a quantum well structure that includes at least a well layer made of $Al_a IN_b Ga_{1-a-b} N$ ($0 \leq a \leq 1$, $0 \leq b \leq 1$, $a+b \leq 1$), and a barrier layer made of $Al_c In_d Ga_{1-c-d} N$ ($0 \leq c \leq 1$, $0 \leq d \leq 1$, $c+d \leq 1$). The nitride semiconductor used for active layer 14 may be any of a non-doped semiconductor, an n-type impurity doped nitride semiconductor and a p-type impurity doped semiconductor. Preferably, a non-doped or n-type impurity type doped nitride semiconductor is used, and thereby, the output of the light emitting element can be increased. More preferably, the well layers are undoped and the barrier layers are doped with an n-type impurity, and thereby, the output of the light emitting element and the light emitting efficiency can be increased. In addition, Al is included in the well layer that is used in the light emitting element, and thereby, a wavelength range which is difficult to gain from the conventional well layer of InGaN, more concretely, a wavelength close to 365 nm, which is the band gap energy of GaN, or a wavelength shorter than that, can be gained. The wavelength of light that is emitted from the active layer 14 is adjusted to be in a range from around 360 nm to 650 nm, preferably from 380 nm to 560 nm, in accordance with the intended use, application or the like of the light emitting element.

The film thickness of the well layer is preferably not less than 1 μm and not greater than 30 nm, more preferably, not less than 2 nm and not greater than 20 nm and most preferably, not less than 3.5 nm and not greater than 20 nm. In the case where the thickness is less than 1 nm, the well layer does not function appropriately, while in the case where the thickness is greater than 30 nm, the crystallinity of the four element mixed crystal InAlGaN is decreased, resulting in the deterioration of the element properties. In addition, in the case where the thickness is not less than 2 nm, the film does not have a large unevenness so that the layer has a comparatively uniform film quality, while in the case where the thickness is not greater than 20 nm, the occurrence of crystal defects is prevented, making the growth of the crystal possible. Furthermore, in the case where the film thickness is not less than 3.5 nm, the output can be increased. This is because an increase in the film thickness of the well layer allows light emitting recombination of a high light emitting efficiency and a high internal quantum efficiency resulting from injection of a great number of carriers in the same manner as an LD driven by a large current and this is particularly effective in a multiple quantum well structure. In addition, the same effect of an increased output as described above can be gained in the case where the film thickness is not less than 5 nm in a single quantum well structure. In addition, though the number of well, layers is not particularly limited, in the case where the number is not less than four, it is preferable to make the film thickness of the well layers be not greater than 10 nm maintaining the small film thickness of active layer 14. In the case where the film thickness of each layer that forms active layer 14 becomes great, the entire film thickness of active layer 14 becomes great, resulting in an increase of $V_f$. In the case of the multiple quantum well structure, it is preferable for the polarity of wells to include at least one well layer of which the film thickness is not greater than 10 nm as described above and it is more preferable for all of the well layers to have a thickness that is not greater than 10 nm as described above.

In addition, it is preferable for the barrier layers to be doped with a p-type impurity or an n-type impurity or to be undoped in the same manner as the case of the well layers. More preferably, an n-type impurity is doped or undoped. In the case where an n-type impurity is doped to the barrier layers, for example, it is necessary for the concentration thereof to be at least $5\times10^{16}/cm^3$ or more. In the case of an LED, for example, it is preferable for the concentration to be not less than $5\times10^{16}/cm^3$ and not greater than $2\times10^{18}/cm^3$. In addition, in the case of an LED or an LD of a high output, it is preferable for the concentration to be not less than $5\times10^{17}/cm^3$ and not greater than $1\times10^{20}/cm^3$ and it is more preferable for the concentration to be not less than $1\times10^{18}/cm^3$ and not greater than $5\times10^{19}/cm^3$. In this case, it is preferable that the well layer does not substantially include an n-type impurity or is grown undoped. In addition, in the case where an n-type impurity is doped to the barrier layers, it may be doped to all of the barrier layers within the active layer or it may be doped to some of the barrier layers with the remaining being undoped. Here, in the case where an n-type impurity is doped to some of the barrier layers, it is preferable for the barrier layers placed on the n-type layer side within the active layer to be doped. In the case where $n^{th}$ barrier layer $B_n$ (n is a positive integer) counted from the n-type layer side is doped, for example, electrons are efficiently injected into the active layer and thus, a light emitting element having an excellent light emitting efficiency and internal quantum efficiency is gained. In addition, as for the well layers, the $m^{th}$ well layer $W_m$ (m is a positive integer) counted from the n-type layer side is doped and, thereby, the same effect as in the above described case of the barrier layers can be gained. In addition, the barrier layers and the well layers are both doped in order to gain the same effect.

Next, a p-type nitride semiconductor layer 15 is formed on active layer 14 of the following plurality of layers (not shown). First, a p-type clad layer has a composition of which the band gap energy is greater than that of active layer 14 and is not particularly limited as long as it can confine carriers in active layer 14. $Al_kGa_{1-k}N$ ($0\leq k<1$) for example, is used and in particular, $Al_kGa_{1-k}N$ ($0<k<0.4$) is preferable. The film thickness of the p-type clad layer is not particularly limited and preferably, it is 0.01 µm to 0.3 µm and more preferably, it is 0.04 µm to 0.2 µm. The p-type impurity concentration in the p-type clad layer is $1\times10^{18}/cm^3$ to $1\times10^{21}/cm^3$ and preferably, $1\times10^{19}/cm^3$ to $5\times10^{20}/cm^3$. In the case where the p-type impurity concentration is in the above described range, the bulk resistance can be lowered without deteriorating the crystallinity. The p-type clad layer may be a single layer or a multilayered film layer (super lattice structure). In the case of the multilayered film layer, the multilayered film layer may be formed of the above described $Al_kGa_{1-k}N$ and a nitride semiconductor layer of which the band gap energy is smaller than that of $Al_kGa_{1-k}N$. $In_lGa_{1-l}N$ ($0\leq l<1$) and $Al_mGa_{1-m}N$ ($0\leq m<1$, m>1), for example, can be cited as a layer having a small band gap energy in the same manner as in the case of n-type clad layer. The film thickness of each layer that forms the multilayered film layer is preferably not greater than 100 Å, more preferably, not greater than 70 Å and most preferably, 10 Å to 40 Å in the case of the super lattice structure. In addition, in the case where the p-type clad layer is a multilayered film layer formed of a layer having a large band gap energy and a layer having a small band gap energy, a p-type impurity may be doped to at least either one of the layers having large and small band gap energies. In addition, in the case where the layers having large and small band gap energies are both doped, the amount of doping may be the same or different.

Next, a p-type contact layer is formed on the p-type clad layer. $Al_fGa_{1-f}N$ ($0\leq f<1$) is used for the p-type contact layer and in particular, the p-type contact layer can be formed of $Al_fGa_{1-f}N$ ($0\leq f<0.3$) making an appropriate ohmic contact with a p electrode, which is an ohmic electrode, possible. It is preferable for the p-type impurity concentration to be not less than $1\times10^{17}/cm^3$. In addition, the p-type impurity concentration is high in the p-type contact layer on the conductive substrate side and it is preferable for the p-type contact layer to have a composition gradient where the ratio of Al in the mixed crystal becomes small on the conductive substrate side. In this case, the composition gradient may have a continuous change in the composition or may have a discontinuous change in the composition in phases. The p-type contact layer can be formed of, for example, a first p-type contact layer which makes contact with an ohmic electrode and which has a high concentration of the p-type impurity as well as a low ratio of Al composition and of a second p-type contact layer which has a low concentration of the p-type impurity as well as a high ratio of Al composition. The first p-type contact layer provides an appropriate ohmic contact and the second p-type contact layer makes the prevention of self absorption possible.

After the nitride semiconductor has been grown on substrate 11 as described above, the wafer is taken out of the reactor unit and after that, heat treatment is carried out in an atmosphere that includes oxygen and/or nitrogen at a temperature that is not less than 450° C. As a result of this, hydrogen that is combined with the p-type layer is removed so that p-type nitride semiconductor layer 15 can be formed so as to exhibit p-type conductivity.

As the layered structure of the nitride semiconductor layer, the structures shown in the following (1) to (5) can be cited:

A buffer layer (of which the film thickness is 200 Å) made of GaN, an n-type contact layer (4 µm) made of Si doped n-type GaN, a light emitting layer (30 Å) having a single quantum well structure made of undoped $In_{0.2}Ga_{0.8}N$, a p-type clad layer (0.2 µm) made of Mg doped p-type $Al_{0.1}Ga_{0.9}N$ and a p-type contact layer (0.5 µm) made of Mg doped p-type GaN.

(2) A buffer layer (of which the film thickness is approximately 100 Å) made of AlGaN; an undoped GaN layer (1 µm); an n-side contact layer (5 µm) made of GaN that includes $4.5\times10^{18}/cm^3$ of Si; an n-side first multilayered film layer (of which the total film thickness is 3350 Å) formed of three layers, a lower layer (3000 Å) made of undoped GaN, an intermediate layer (300 Å) made of GaN that includes $4.5\times10^{18}/cm^3$ of Si and an upper layer (50 Å) made of undoped GaN; an n-side second multilayered film layer (of which the total film thickness is 640 Å) having a super lattice structure where ten layers of undoped GaN (40 Å) and ten layers of undoped $In_{0.1}Ga_{0.9}N$ (20 Å) are alternately layered in a repetitive manner and undoped GaN (40 Å) is further layered on the top; a light emitting layer (of which the total film thickness is 1930 Å) having a multiple quantum well structure where six barrier layers (250 Å) made of undoped GaN and six well layers (30 Å) made of $In_{0.3}Ga_{0.7}N$ are alternately layered in a repetitive manner and a barrier layer (250 Å) made of undoped GaN is further layered on the top; a p-side multilayered film layer (of which the total film thickness is 365 Å) having a super lattice structure where five layers of $Al_{0.15}Ga_{0.85}N$ (40 Å) that includes $5\times10^{19}/cm^3$ of Mg and five layers of $In_{0.03}Ga_{0.97}N$ (25 Å) that includes $5\times10^{19}/cm^3$ of Mg are alternately layered in a repetitive manner and $Al_{0.15}Ga_{0.85}N$ (40 Å) that includes $5\times10^{19}/cm^3$ of Mg is further layered on the top; and a p-side contact layer (1200 Å) made of GaN that includes $1\times10^{20}/cm^3$ of Mg.

(3) A buffer layer (of which the film thickness is approximately 100 Å) made of AlGaN; an undoped GaN layer (1 µm); an n-side contact layer (5 µm) made of GaN that includes $4.5\times10^{18}/cm^3$ of Si; an n-side first multilayered film (of which the total film thickness is 3350 Å) formed of three layers, a lower layer (3000 Å) made of undoped GaN, an intermediate layer (300 Å) made of GaN that includes $4.5\times10^{18}/cm^3$ of Si and an, upper layer (50 Å) made of undoped GaN; an n-side second multilayered film layer (of which the total film thickness is; 640 Å) having a super lattice structure where ten layers of undoped GaN (40 Å) and ten layers of undoped $In_{0.1}Ga_{0.9}N$ (20 Å) are alternately layered in a repetitive manner and undoped GaN (40 Å) is further layered on the top; a light emitting layer (of which the total film thickness is 1930 Å) having a multiple quantum well structure where six barrier layers (250 Å) made of undoped GaN six well layers (30 Å) made of $In_{0.3}Ga_{0.7}N$, six first barrier layers (100 Å) made of $In_{0.2}Ga_{0.98}$ and six second barrier layers (150 Å) made of undoped GaN are alternately layered in a repetitive manner (the number of layers alternately layered in a repetitive manner is preferably in a range from 3 to 6); a p-type multilayered film layer (of which the total film thickness is 365 Å) having a super lattice structure where five layers of $Al_{0.15}Ga_{0.85}N$ (40 Å) that includes $5\times10^{19}/cm^3$ of Mg and five layers of $In_{0.03}Ga_{0.97}N$ (25 Å) that includes $5\times10^{19}/cm^3$ of Mg are alternately layered in a repetitive manner and $Al_{0.15}Ga_{0.85}N$ (40 Å) that includes $5\times10^{19}/cm^3$ Of Mg is further layered on the top; and a p-side contact layer (1200 Å) made of GaN that includes $1\times10^{20}/cm^3$ of Mg.

Here, the lower layer (3000 Å) made of undoped GaN which is provided on the n-side from among the above described layers may be a lower layer having a three-layered structure formed of a first layer (1500 Å) made of undoped GaN, a second layer (100 Å) made of GaN that includes $5\times10^{17}/cm^3$ of Si and a third layer (1500 Å) made of undoped GaN starting from the bottom and, thereby, it becomes possible to suppress the fluctuation of Vf during the elapse of driving time of the light emitting element.

Furthermore, GaN or AlGaN (2000 Å) may be formed between the p-side multilayered film layer and the p-side contact layer. This layer is formed undoped and exhibits p-type due to the diffusion of Mg from the adjoining layers. By providing this layer, withstanding electrostatic voltage of the light emitting element is increased. In case of the usage in a light emitting device to which an electrostatic protective function is separately provided, it is not necessary to provide this layer. However, this layer can increase the withstanding electrostatic voltage in the case where no electrostatic protective means such as an electrostatic preventative element is provided to the outside of the light emitting element and, therefore, it is preferable to provide this layer.

(4) A buffer layer; an undoped GaN layer; an n-side contact layer made of GaN that includes $6.0\times10^{18}/cm^3$ of Si; an undoped GaN layer (the above form is an n-type nitride semiconductor layer of which the total film thickness is 6 nm); a multiple quantum well light emitting layer (of which the total film thickness is 1000 Å) where five GaN barrier layers that include $2.0\times10^{18}/cm^3$ of Si and five InGaN well layers are alternatively layered in a repetitive manner; and a p-type nitride semiconductor layer (of which the film thickness is 1300 Å) made of GaN that includes $5.0\times10^{18}/cm^3$ of Mg.

Furthermore, an InGaN layer (30 Å to 100 Å, preferably 50 Å) may be provided on the p-type nitride semiconductor layer. As a result of this, this InGaN layer becomes a p-side contact layer that makes contact with an electrode.

(5) A buffer layer; an undoped GaN layer; an n-side contact layer made of GaN that includes $1.3\times10^{19}/cm^3$ of Si; an undoped GaN layer (the above form is an n-type nitride semiconductor layer of which the total film thickness is 6 nm); a multiple quantum well light emitting layer (of which the total film thickness is 800 Å) where seven GaN barrier layers that include $3.0\times10^{18}/cm^3$ of Si and seven InGaN well layers are alternately layered in a repetitive manner; and a p-type nitride semiconductor layer made of GaN that includes $2.5\times10^{20}/cm^3$ of Mg. An InGaN layer (30 Å to 100 Å, preferably 50 Å) may be formed on this p-type nitride semiconductor layer as a p-side contact layer.

[Translucent Conductive Layer 17]

Translucent conductive layer 17 is formed on p-type nitride semiconductor layer 15 that has been grown as describe above. Here, translucency means transmission of the wave length of the light emitted by the light emitting element and does not necessarily mean transparent and colorless. Translucent conductive layer 17 preferably includes oxygen in order to make ohmic contact. A variety of types exists as translucent conductive layer 17 that includes oxygen and in particular, an oxide that includes at least one element selected from the group consisting of zinc (Zn), indium (In) and tin (Sn) is preferable. Concretely speaking, it is desirable to form translucent conductive layer 17 that includes an oxide of Zn, In or Sn such as ITO, ZnO, $In_2O_3$ or $SnO_2$ and preferably ITO is utilized. Furthermore, translucent conductive layer 17 may be formed of ITO after a thin film of metal such as Ni has been formed so as to have translucency.

In order to make oxygen atoms be included in translucent conductive layer 17, heat treatment may be carried out in an atmosphere that includes oxygen after a layer to contain oxygen atoms has been formed. Alternatively, the respective layers can be made to contain oxygen atoms by means of reactive sputtering, ion beam assisted deposition, or the like.

By interposing translucent conductive layer 17 without contacting the reflective layer 16, such as a metal film, with the nitride semiconductor layer, ohmic contact can be made with the nitride semiconductor layer. In particular, p-type nitride semiconductor layer 15 tends to have a high resistance, and therefore, it becomes important to reduce the contact resistance in this interface. Furthermore, an uneven surface 22 is provided on translucent conductive layer 17 and, thereby, it becomes unnecessary to provide unevenness directly on the nitride semiconductor. As a result of this, uneven surface 22 can be formed while avoiding a difficult process which may cause deterioration in the electrical properties.

[Uneven Surface 22]

Figure 4:
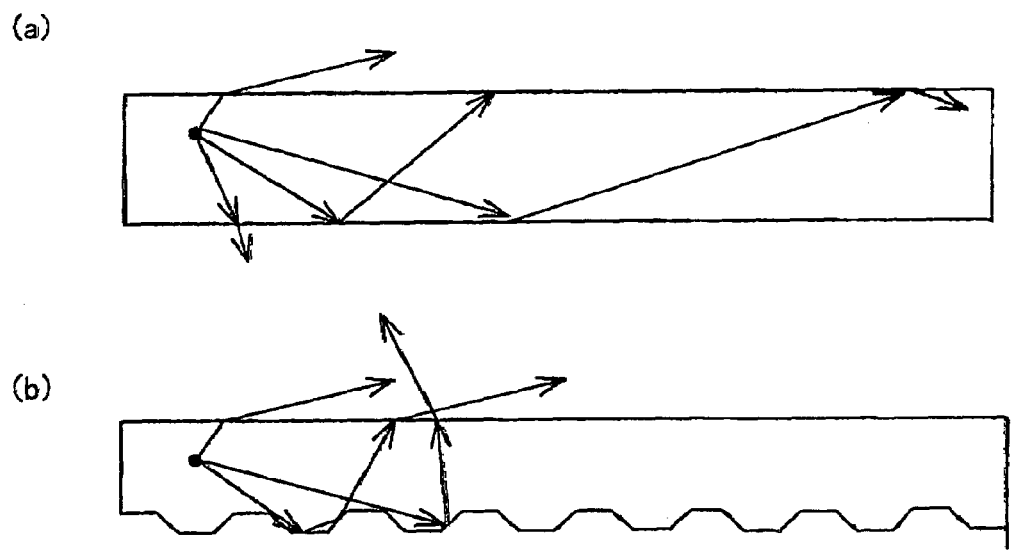
FIGS. 4(*a*) and 4(*b*) are explanatory diagrams; showing the appearance of the manner in which light that has been reflected from a reflective surface is emitted from the main light emitting surface in a light emitting element.

Uneven surface 22 is formed on translucent conductive layer 17. Uneven surface 22 is formed by means of etching carried out through a resist pattern, according to a method such as RIE (reactive ion etching) or ion milling. In the example of FIG. 3, uneven surface 22 has a pattern wherein a plurality of mesa type dimples with inclined surfaces in isosceles trapezoid forms are provided. The manner where the light emitting efficiency is improved as a result of the formation of such an uneven pattern is described below in reference to FIG. 4. FIGS. 4(a) and 4(b) show a light emitting element where the upper surface is the main light emitting surface and the lower surface is a reflective surface, that is to say, a surface for reflecting light for the purpose of making light directed downwards be emitted from the upper side of the element. As shown in FIG. 4(*a*), in the case where the reflective surface of the light emitting element having a light emitting portion is flat, the angle of incidence of light that is reflected form the reflective surface becomes equal to the angle of emergence and, therefore, light that has entered at an angle greater than the critical angle relative to the normal line to the main light emitting surface does not come out from the upper surface of the light emitting element as a result of the total internal reflection.

In contrast to this, as shown in FIG. 4(*b*), uneven surface 22 is provided as the reflective surface and, thereby, the reflective angles are changed, causing the effect such as scattering of light and the light is emitted to the outside at the point in time when the angle of emergence becomes not greater than the critical angle while the light continues to be reflected. As a result of this, the majority of the reflected light is emitted to the outside at an angle not greater than the critical angle and, thereby, the light emitted efficiency can be greatly improved.

As for the inclination angles of the inclined surfaces of the unevenness, in the case where angle X of light relative to the normal line to the main light emitting surface is in a range of $0°<X<65°$, probability of light being reflected at an angle that is not greater than the critical angle becomes high in a manner where the light emitting efficiency is improved, which is preferable.

Figure 5:
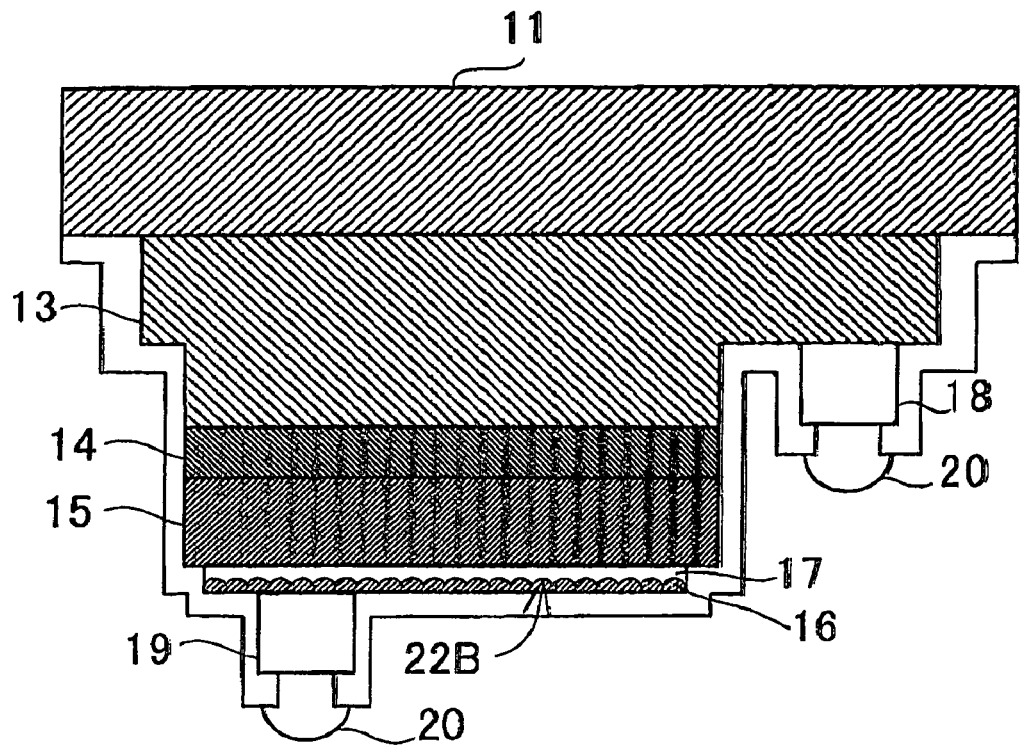
FIG. 5 is a schematic cross-sectional diagram showing a nitride semiconductor light emitting element according to Modification 1 of the first embodiment of the present invention.
Figure 6:
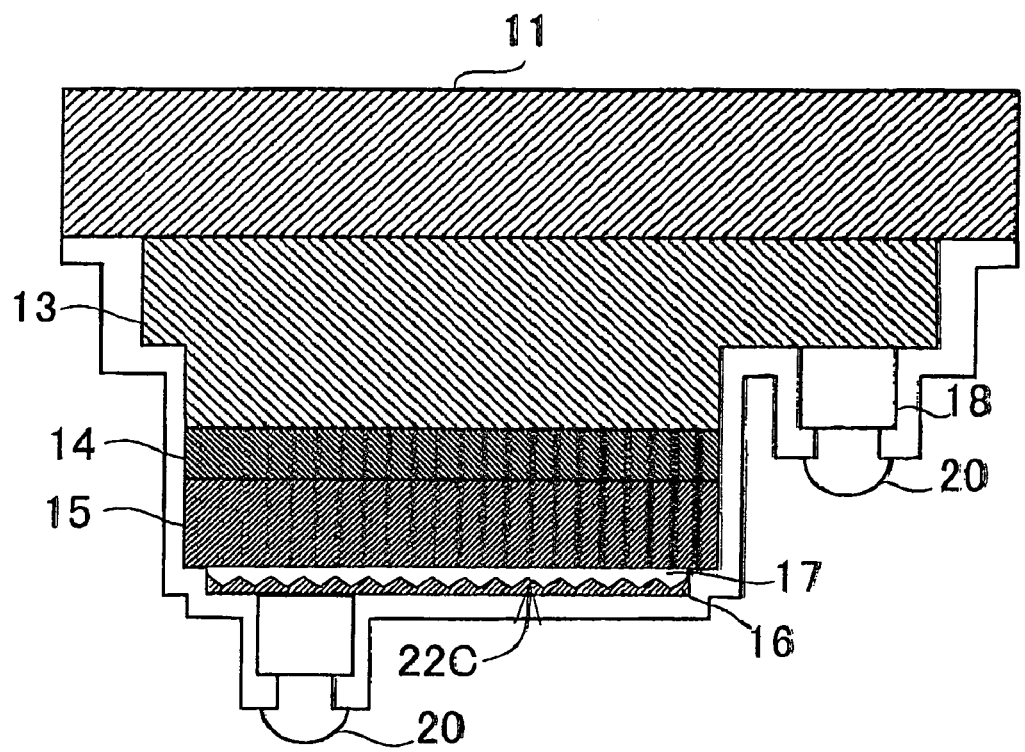
FIG. 6 is a schematic cross-sectional diagram showing a nitride semiconductor light emitting element according to Modification 2 of the first embodiment of the present invention.
Figure 7:
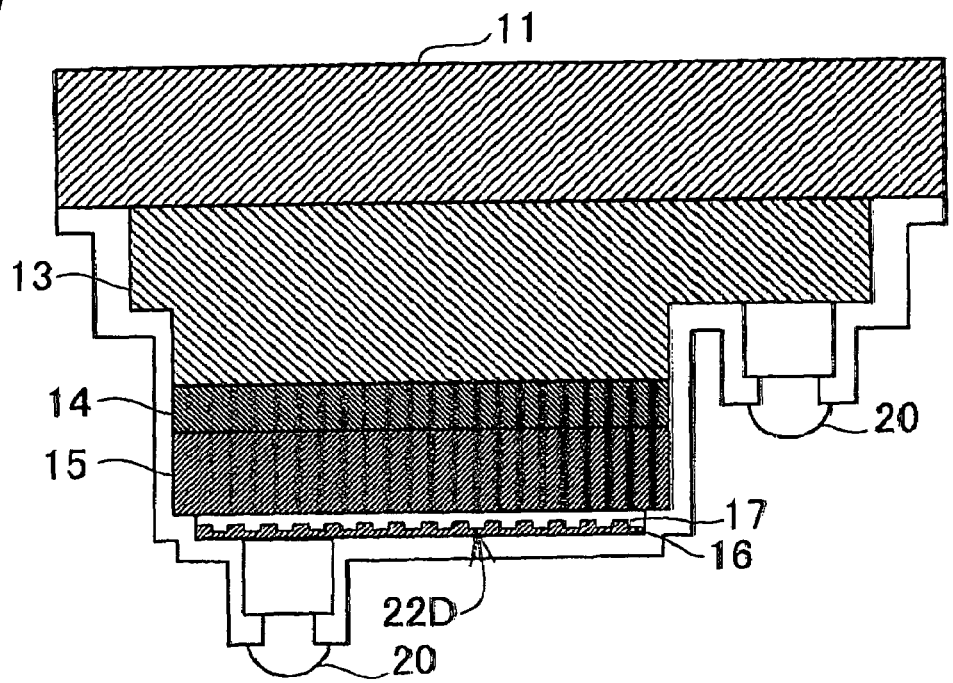
FIG. 7 is a schematic cross-sectional diagram showing a nitride semiconductor light emitting element according to Modification 3 of the first embodiment of the present invention.

Arbitrary forms for gaining the effect of scattering of light can be adopted as the pattern of uneven surface 22 in addition to isosceles trapezoid forms as shown in FIGS. 3 and 4. An uneven surface 22 B in the form of connected cylindrical lenses of which the cross section is a combination of semi-circular forms as shown in FIG. 5 may be formed as shown in Modification 1 of the first embodiment. The cylindrical forms allow light to be efficiently emitted to the outside in the upward direction. In addition, in Modification 2 of the first embodiment, an uneven surface 22C can be formed in the form of triangular waves as shown in FIG. 6. These configurations of FIGS. 5 and 6 do not have a flat surface parallel to the interface between translucent conductive layer 17 and the reflective layer unlike that of FIG. 3 and, therefore, the regions where the total internal reflection may occur can be greatly reduced so that the emitting efficiency to the outside can be increased. Furthermore, in Modification 3 of the first embodiment an uneven surface 22D in the form of rectangle waves can be provided as shown in FIG. 7. In addition the adjoining dimples in the pattern in the form of continued cylindrical lenses of FIG. 5 may be provided with spaces between them or may be altered so that the cross section thereof. Is changed into the form of continued ellipses from the form of continued circles, though this is not shown. Alternatively, the dimples in the pattern can be changed into the form of circular columns, cones or polygonal columns such as prisms or square columns from the form of stripes as shown in the example. Alternatively, the pattern can have a convex or concave in the form of a single dome. The light emitting efficiency can be improved by providing the above described pattern. Here, in the present specification, unevenness may not necessarily be formed as a pattern where protruding portions and recess portions but rather, may include patterns where only protruding portions or only recess portions are combined.

Furthermore, these uneven patterns need not to be a uniform pattern through the entirety, but rather, a plurality of patterns may be combined or the density of the distribution of a pattern may be changed if necessary. The density of the pattern in the uneven surface can be increased for a region where the intensity of light is high, for example, in accordance with the two dimensional distribution of the density of the output of light from the active layer so that a great amount of light can be emitted to the outside. Alternatively, in accordance with the three dimensional illumination pattern with light, the inclination of the surfaces in FIG. 4(*b*) can be made steeper or the density of the dimples can be increased, for example, in a region where the angle of incidences of light entering the reflective layer is great relative to the direction of the normal line to the main light emitting surface so that the probability of light that can be emitted at an angle that is not greater than the critical angle can be increased.

The thickness of this translucent conductive layer 17 is adjusted so that an uneven surface can be formed, and is preferably not greater than 1 μm and more preferably, is in a range from 100 Å to 5000 Å. When the film thickness is 1000 Å, the ohmic property is confirmed and when the thickness is increased thereafter, the annealing temperature tends to increase. In addition, it is preferable for the thickness to be approximately integer times of $\lambda/4$, wherein the wave length of light that is emitted from active layer 14 is $\lambda$. This is because intensive light is emitted from the translucent conductive layer due to the interference of light within the translucent conductive layer.

Unevenness is formed on the surface of translucent conductive layer 17. The form of the unevenness is not particularly limited, but rather, can be appropriately adjusted, taking the light emitting efficiency into consideration. A pattern in periodical or irregular lattice form or a periodical or irregular alignment pattern of circles, polygons or polygons of which the corners are slightly rounded, for example, can be cited as the above described form of the unevenness. In particular, a convex pattern such as triangles, quadrilaterals or hexagons where protruding portions and recess portions can be tightly arranged is preferable. Here, these patterns may have different forms between the surface and the bottom of the patterns, according to the method for forming them. That is to say, the patterns may have forms with narrower widths or forms where the corners of each piece of the patterns are rounded as the patterns become closer to the surface. In the case of a periodical pattern, it is appropriate for the pitch of the pieces of the pattern to be not greater than approximately 1 μm, not greater than approximately 700 nm, not greater than approximately 500 nm, not greater than approximately 300 nm or the like. The height of the unevenness is not particularly limited, and, for example, the height that is not greater than approximately 2 μm, not greater than approximately 500 nm or the like can be cited, and is preferably in a range from approximately 10 nm to 500 nm. It is preferable for such an uneven pattern to be set so as to satisfy the relationship $d \leq W$, for example, wherein the depth of the recesses is d and the width of the pieces of the pattern on the upper surface is W. As a result of this, the reflection of light can be controlled so that the light emitting efficiency can be increased.

[Reflective Layer 16]

As described above, a reflective layer 16 is formed on translucent conductive layer 17 on which uneven surface 22 has been formed. Reflective layer 16 can be formed of, for example, a metal film. It is preferable for the metal film to be partially oxidized in order to be properly connected to translucent conductive layer 17 that contains oxygen. In such a manner, the reflective layer of the metal film is connected to the nitride semiconductor layer via translucent conductive layer 17, and thereby, a proper ohmic connection can be made between translucent conductive layer 17 and the semiconductor layer.

In addition, when a metal film is directly joined to a nitride semiconductor, a problem may arise where the nitride semiconductor layer is contaminated by an impurity that is diffused from the metal film, or a problem may arise where the joint in the interface is poor, causing peeling or the like, decreasing the yield. In the case where an oxide film intervenes in the interface, the oxide film works as a protective film, blocking the diffusion. In addition, though adhesion between an oxide film and a metal film is generally poor, adhesiveness can be increased by providing uneven surface 22 and increasing the contact area.

Figure 8:
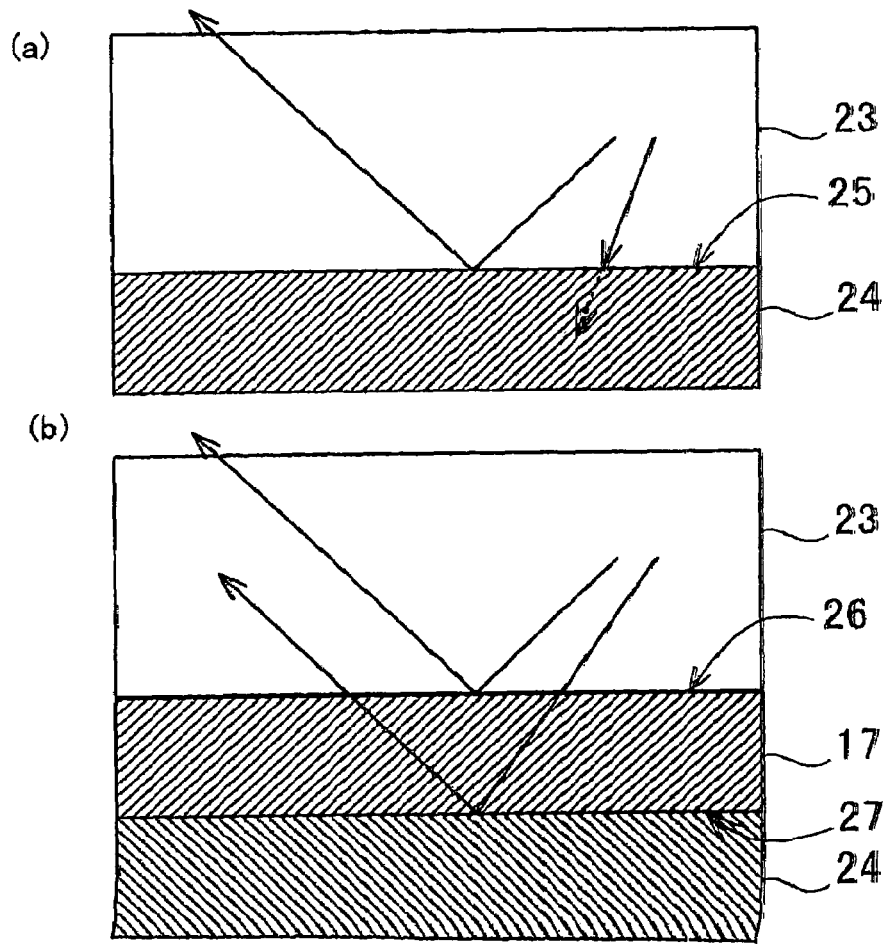
FIGS. 8(a) and 8(b) are explanatory diagrams showing a change in light absorption when a translucent conductive layer intervenes between a nitride semiconductor layer and a reflective layer made of a metal film.

In addition, an other problem arises where light is absorbed in the interface, causing the light emitting efficiency to deteriorate. As shown in FIG. 8(*a*), when nitride semiconductor layer 23 made of, for example, GaN is directly joined to the reflective layer of metal film 24 without intervention by translucent conductive layer 17, light absorption occurs in interface 25 between the semiconductor layer and the metal film, reducing the amount of light that can be effectively emitted. The absorption ratio differs, depending on the materials, and is approximately 10% in the case of Al and GaN. In contrast to this, when, as shown in FIG. 8(*b*), translucent conductive layer 17 made of, for example, ITO is made to intervene, light absorption can be suppressed, in interface 26 between the nitride semiconductor and the translucent conductive layer, and light absorption can also be suppressed in interface 27 between the reflective layer of metal film 24 and the translucent conductive layer, thus increasing the amount of light that can be effectively utilized and improving the light emitting efficiency and the external quantum efficiency so that the output of light emission can be increased. In addition to this, a larger amount of light can be emitted to the outside by providing uneven surface 2.2 to the above described interface, further increasing the output.

The film thickness of the metal film is made to be preferably not less than 200, more preferably not less than 500 Angstroms, and thereby, a sufficient amount of light can be reflected. Though not particularly limited, the upper limit may be not greater than 1 μm.

A material that can form an electrode for a p-type nitride semiconductor and that can form a thin film having high reflectance is utilized for the metal film. In particulars preferable is a single-layer or multiple-layer of a metal or an alloy that includes at least one of element selected from the group consisting of aluminum (Al), silver (Ag), zinc (Zn), nickel (Ni), platinum (Pt), palladium (Pd), rhodium (Rh), ruthenium (Ru), osmium (Os), iridium (Ir), titanium (Ti), zirconium (Zr), hafnium (Hf), vanadium (V), niobium (Nb), tantalum (Ta), cobalt (Co), iron (Fe), manganese (Mn), molybdenum (Mo), chromium (Cr), tungsten (W), lanthanum (La), copper (Cu) and yttrium (Y). These metals or alloys allow for a preferable ohmic connection with a nitride semiconductor, and are useful for reducing the voltage in the forward direction of the light emitting element. In particular, it is preferable for the layer to include at least one element selected from the group consisting of Al, Ti, Pt, Rh, Ag, Pd and Ir, and it is more preferable for the layer to include aluminum, rhodium or silver so as to be a highly reflective layer. In particular, in the case where aluminum, rhodium or silver is used in the configuration of the present invention, the reflectance from the uneven surface can be 70% or higher, and thereby, the absorption of wavelengths in the range from around 360 nm to 650 nm, more desirably in the range from 380 nm to 560 nm, by the light emitting element made of a nitride semiconductor can be reduced so that a more preferable ohmic contact can be made. In addition, the layer of the metal film may have a layered structure of metals listed in the above. In addition, an annealing treatment may later be carried out on the electrode so that the electrode material can be fused so as to be integrated with the metal material in the form of an alloy.

The above described translucent conductive layer 17 and reflective layer 16 may have a multilayered structure. The index of refraction of a first layer located on the semiconductor layer side becomes smaller in phases that that of a second layer in the multilayered structure, for example, and thereby, light emission from the light emitting element can be increased.

[Dielectric]

In addition, reflective layer 16 can be formed of a dielectric. The dielectric preferably has a layered structure of an oxide. Since an oxide is chemically more stable than a metal, a reflective layer made of an oxide can be utilized with more reliance than that made of a metal film. In addition, a reflective layer made of an oxide can have a reflectance of not less than 98%, which is a value that is very close to 100%, so that loss in the reflective layer resulting from light absorption can be extremely reduced.

In the case were a reflective film is formed of a dielectric, a multilayered structure can be adopted. Preferably, the dielectric includes at least any of Si, Zn, Ti, Zr, Hf, Nb and Ta.

Furthermore, when a dielectric is utilized, coating on the surface becomes easy, and therefore, it becomes possible to provide a reflective layer of a dielectric on surfaces that cross the main surfaces of substrate 11, that is to say, on the sides of the light emitting element in FIG. 3, in addition to the surface of the light emitting element which is the contacting surface when the element is mounted, so that light in the lateral direction can be efficiently reflected so as to be emitted from the element. As a result of this, usage of a dielectric can contribute to an increase in light emission in the upward direction by making reflective layers provided on the sides of the semiconductor suppress leakage of light in the lateral direction.

Figure 9:
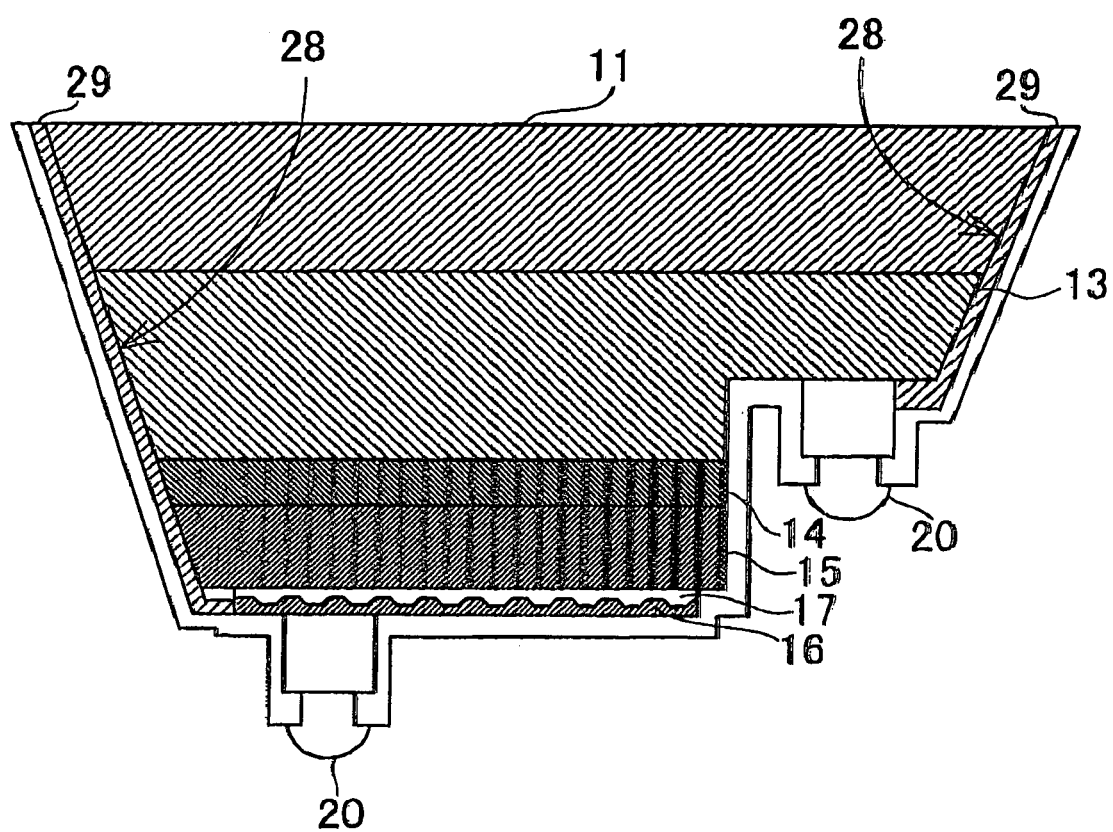
FIG. 9 is a schematic cross-sectional diagram showing a nitride semiconductor light emitting element according to Modification 4 of the first embodiment of the present invention.

Furthermore, in Modification 4 of the first embodiment, as shown in FIG. 9, inclined surfaces 28 are provided on the sides of the semiconductor layers of the light emitting element, and thereby, light toward the sides can be reflected upward, further increasing the light emitting efficiency. This structure can be altered in a manner where inclined surfaces 28 are in dome form, so that light is effectively reflected upward as the emitted light, achieving an extremely high light emitting efficiency. These inclined surfaces 28 may be curved surfaces or flat surfaces. Curved surfaces can increase the reflective efficiency more than the flat surfaces. Dielectric reflective layers 29 can be formed on inclined surfaces 28 so that light in the lateral direction can be reflected without fail so as to be effectively outputted, increasing the efficiency. In addition, this configuration can be applied to a configuration wherein no reflective layers are provided on the sides, though this is not shown.

In addition, in order to form these layers, a technique such as vapor deposition or sputtering can be used in a conventional vapor phase film growing unit. In addition, a metal-organic chemical vapor deposition, (MOCVD) method, a vapor deposition method, a sputtering method and the like can be selectively used for the formation of different grown films, so that a variety of layers can be formed. Furthermore, it is possible to form a film according to a sol-gel method. A film for a certain layer may be grown according to a vapor deposition method, for example, while a film for another layer may be grown according to a sputtering method. In particular, when a film for translucent conductive layer 17 is grown directly on the nitride semiconductor layer without an intervening metal film, it is preferable to use a vapor deposition method. As described above, an appropriate film growing method is selected from among others, and thereby, film quality is increased, proper ohmic connection can be made between a translucent electrode and a nitride semiconductor, and the contact resistance in the connection can be lowered. In addition, an appropriate patterning method, such as wet etching, dry etching or lifting off, can be selected from others in order to pattern the interface between translucent conductive layer 17 and reflective layer 16.

Here, though translucent conductive layer 17 and reflective layer 16 are provided to the p-type layer in the nitride semiconductor light emitting element according to the present embodiment, translucent conductive layer 17 and the like may, of course, be provided to the n-type layer in other embodiments. A configuration where light is primarily emitted from the n-type layer side, for example, may be provided, and uneven surface 22 is formed on the pad electrodes of the n layer in order to provide a reflective film.

[Pad Electrode]

The pad electrode may or may not be provided on the surface of the reflective layer in the present embodiment. In addition, the pad electrode may be provided on a layer that includes the layer which functions as the reflective layer, and may be formed on translucent conductive layer 17, which is provided on the side of one nitride semiconductor layer and on the side of the other nitride semiconductor layer, from among the p-type nitride semiconductor layer 15 side and the n-type nitride semiconductor layer 13 side. In addition, a portion of the pad electrode according to another embodiment of the present invention may be extended into a through hole provided in translucent conductive layer 17 so as to be directly provided to the nitride semiconductor layer, or may be directly provided to the nitride semiconductor layer at the outer periphery of translucent conductive layer 17. As described above, a portion of the pad electrode is directly provided to the nitride semiconductor layer and thereby, the pad electrode can be prevented from peeling.

A conductive member such as an Au bump can be placed on the surface of the pad electrode so that an electrical connection can be achieved between the electrode of the light emitting element and an external electrode which face each other through the conductive member.

In addition, it is preferable for the pad electrodes formed on the p-type nitride semiconductor layer 15 side and on the n-type nitride semiconductor layer 13 side to have the same configuration in terms of the type of used metal and the film thickness. The same configuration as described above allows the pad electrodes to be simultaneously formed on the p-type nitride semiconductor layer 15 side and on the n-type nitride semiconductor layer 13 side, and therefore, the process for forming the pad electrodes can be simplified in comparison with the case where pad electrodes on the p-side nitride semiconductor layer 15 side and on the n-type nitride semiconductor layer 13 side are formed separately. As the pad electrodes in the present embodiment, Ti/Rh/Pt/Au electrodes where Ti, Rh, Pt and Au are respectively layered in sequence by means of sputtering, starting from the p-type nitride semiconductor layer 15 side or the n-type nitride semiconductor layer 13 side, and W/Pt/Au electrodes where W, Pt and Au are respectively layered in sequence by means of sputtering (the respective film thicknesses thereof are, for example, 20 nm/200 nm/500 nm), for example, can be cited. The pad electrodes can make a proper connection with a conductive wire of which the main component is Au by providing Au to the top layers of the pad electrodes. In addition, Pt is layered between Rh and Au, and thereby, diffusion of Au or Rh can be prevented. In addition, Rh is preferably used in order to increase the light emitting efficiency, because of its excellent light reflection and barrier properties.

In the case where an LED or a laser is fabricated as the light emitting element, it is generally formed by growing the respective semiconductor layers on a specific substrate. At this time, both of the p electrode and n electrode are generally formed on the same side of the semiconductor layer in the case where an insulating substrate made of, for example, sapphire, is used as the substrate, and this insulating substrate is not removed in the end. As a result of this, flip chip mounting can be implemented wherein the insulating substrate side is positioned in a manner where the substrate side from which light is emitted is visible. The substrate can, of course, be removed in the end, before flip chip mounting is carried out. As described above, the light emitting efficiency can be increased, and the external quantum efficiency can be increased so that greater light emitting power can be gained.

Embodiment 2

The semiconductor element according to another embodiment of the present invention is provided with: a substrate 11 which has a pair of main surfaces that face each other; a semiconductor layer of a first conductivity type on one of the main surfaces of the above described substrate 11; a semiconductor layer of a second conductivity type on the above described semiconductor layer of the first conductivity type; an active layer 14 formed between the above described semiconductor layer of the first conductivity type and the semiconductor layer of the second conductivity type; and a reflective layer 16 formed on the above described semiconductor layer of the second conductivity type for reflecting light from the above described active layer 14 toward the above described semiconductor layer of the second conductivity type.

Figure 10:
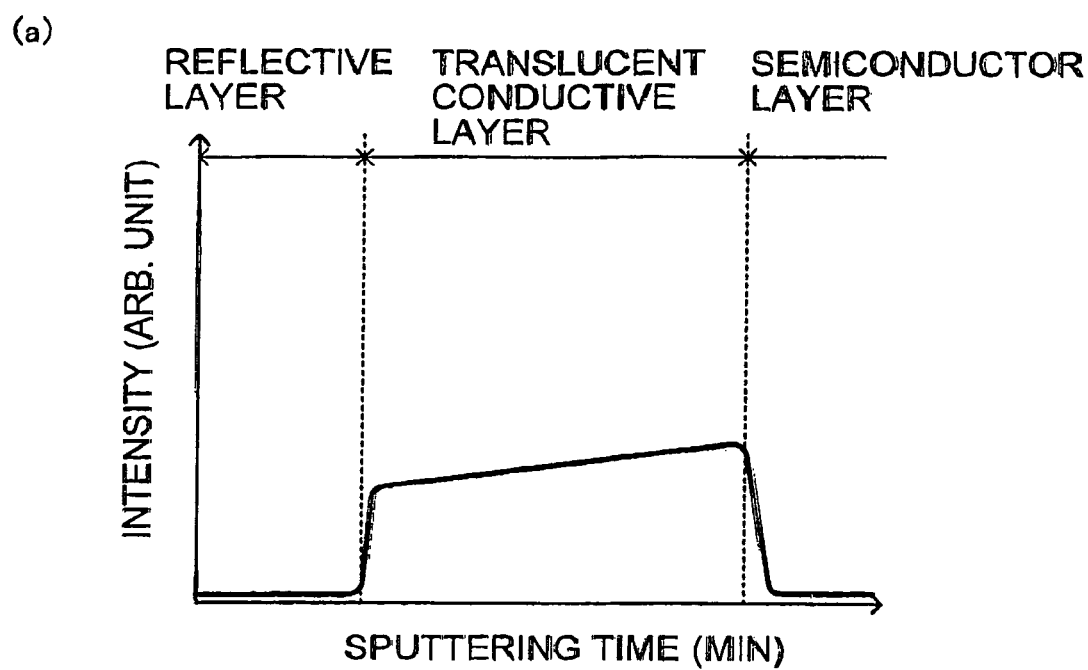
FIGS. 10(a) and 10(b) are graphs showing the depth profile of tin in an ITO film.
Figure 10:
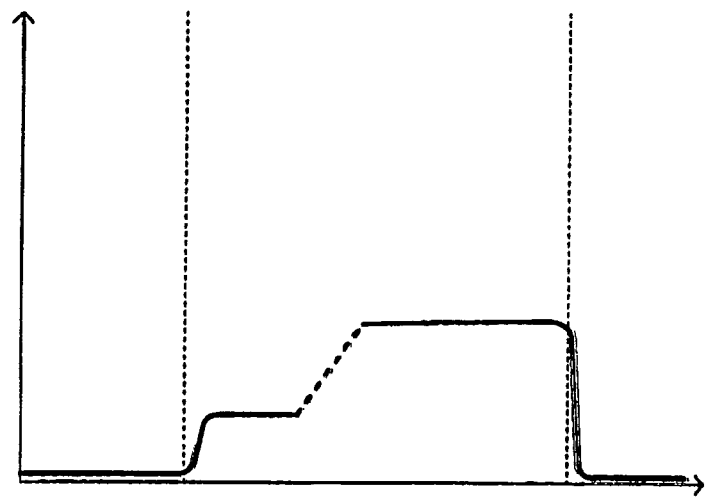

This semiconductor element can be mounted on a circuit board as a light emitting element, with the other main surface of the above described substrate 11 being the main light emitting surface. Furthermore, a translucent conductive layer 17 is formed between the above described reflective layer 16 and the semiconductor layer of the second conductivity type, and translucent conductive layer 17 includes at least one of element C selected from the group consisting of at least zinc, indium, tin and magnesium, as well as a trace element D. In this configuration, light emitted from the active layer in the semiconductor layer transmits through the translucent conductive layer and is reflected appropriately from the reflective layer so that the light is emitted to the outside. In particular, the concentration of the trace element D in the vicinity of the interface between the semiconductor layer and the translucent conductive layer made of an oxide film is higher than the concentration of the trace element D in the other portion of the oxide film, and thereby, the translucent conductive layer has more carriers in the vicinity of the interface vis-à-vis the semiconductor layer than the remaining portion of the film. This trace element D has a specific distribution of concentration in the direction of the film thickness, and thereby, a conductive oxide film having excellent crystallinity and conductance can be provided. Concretely speaking, in the case where there is too much of the trace element D, the crystallinity is deteriorated, though the conductance tends to be high, and the material is not preferable for a translucent electrode. That is to say, it is preferable for the film to have both a region of a high concentration of the trace element D and a region of a low concentration of the trace element D in the direction of the film thickness. In particular, it is more preferable for the concentration of the trace element D in the vicinity of the interface between the semiconductor layer and the oxide film to be higher than the concentration of the trace element D in the other portion of the conductive oxide film. In the case where the conductive oxide film is made of ITO, for example, the trace element D is tin. A high concentration of carriers can be gained in ITO when oxygen deficiency is great, and a high concentration of carriers can also be gained when the amount of doped tin is great. Here, in the case where the amount of doped tin is too great, crystallinity deteriorates, though the concentration of carriers becomes high, which, in general, is not preferable for a translucent electrode. In the embodiment of the present invention, however, a proper ohmic contact can be made between the conductive oxide film and the semiconductor layer when the amount of doped tin is great in the vicinity of the interface between the oxide film and the semiconductor layer, and at the same time, the oxide film becomes a film having appropriate crystallinity when the amount of doped tin is small in the other region, which is preferable. This state is measured by an AES (Auger electron spectroscopy) unit exhibiting the tendency shown in FIG. 10. FIG. 10 is a graph showing the depth profile of tin in the ITO film. The depth profile indicates a change in the concentration of an element in a substance at a depth ranging from the surface of the substance to the inside of the substance, and a distribution of the concentration in the direction of the depth. FIG. 10($a$) shows a case where there is a continuous gradient of the concentration of tin, and FIG. 10($b$) is a graph showing the general tendency of the concentration of tin. In addition, the amount of doped tin is provided in the vicinity of the interface between the oxide film and the semiconductor layer so as to maintain the condition of high mobility, that is to say, so as to maintain the condition of best conductivity, and thereby, the current that has been injected into the conductive oxide film is diffused through the entirety of the film, and furthermore, the film allows the current to uniformly diffuse through the semiconductor layer, which is preferable.

In addition, it is more preferable for the concentration of the trace element D in the vicinity of the interface between the semiconductor layer and the film to be higher than the concentration of the trace element D in the vicinity of the surface that faces the interface. The conductive oxide film has a reflective film on the surface that faces the interface between the conductive oxide film and the semiconductor layer, and this reflective film makes contact with the conductive oxide film. As a result, light emitted from the active layer in the semiconductor layer transmits through the conductive oxide film so as to be properly reflected from the reflective layer. In particular, in the case where the reflective layer includes at least one of element selected from among aluminum, titanium, platinum, rhodium, silver, palladium, iridium, silicon and zinc, such a reflective layer has good conductance, and thus many carriers in comparison with the semiconductor layer, and as a result, the Schottky barrier between the reflective layer and the conductive oxide film is small, making it comparatively easy to make an ohmic contact, in such an interface, the amount of doped tin can be reduced, increasing crystallinity so that the reflective layer can function adequately. This is also true when taking the surface condition of the conductive oxide film into consideration, and the conductive oxide film made of an oxide that includes element C has a coarse surface in the case where the conductive oxide film has a large amount of trace element D. Such a surface condition is not preferable for gaining appropriate reflection properties because a reflective layer formed on such a coarse surface has either an unstable crystal orientation of metal or poses a difficulty for the formation of an appropriate interface due to the condition resulting from a large amount of trace element D. That is to say, it is preferable for the interface between the conductive oxide film and the reflective layer that includes a metal element to have an appropriate crystallinity, gained by reducing the amount of carriers. The conductive oxide film has a large amount of trace element D in the interface between the conductive oxide film and the semiconductor layer, and contrarily, has a small amount of trace element D in the interface the conductive oxide film and the metal, and thereby a semiconductor light emitting element having appropriate ohmic properties and appropriate reflection properties, which leads to a high light emission, can be gained.

As for the above described configuration that includes the trace element D, tin doped into $In_2O_3$ and aluminum doped into ZnO, for example, are preferable in order to gain a conductive oxide film having such a specific distribution of concentration. Concretely speaking, in the present invention, "the conductive oxide film that includes the trace element D" means that it includes element D of which the amount is not greater than approximately 20% of that of element C.

In addition, though the trace element D is described in terms of the doped amount, it indicates the amount of trace element D that the semiconductor element contains, and does not indicate the amount of trace element D that exists in the conductive oxide at the time when the conductive oxide film is formed. The amount of trace element D that exists in the film after the formation thereof is indicated, and such a film includes a film in the condition where the trace element D has moved due to thermal diffusion or the like.

Concerning the conductive oxide film, preferable materials for element C and the trace element D are preferably the same as those in embodiment 1. Furthermore, heat treatment may be carried out in an atmosphere that includes oxygen, after the formation of the layer that contains oxygen atoms, in order to include oxygen atoms in the conductive oxide film (translucent conductive layer 17). Alternatively, oxygen atoms can be contained by means of reactive sputtering, ion beam assisted deposition or the like.

Figure 11:
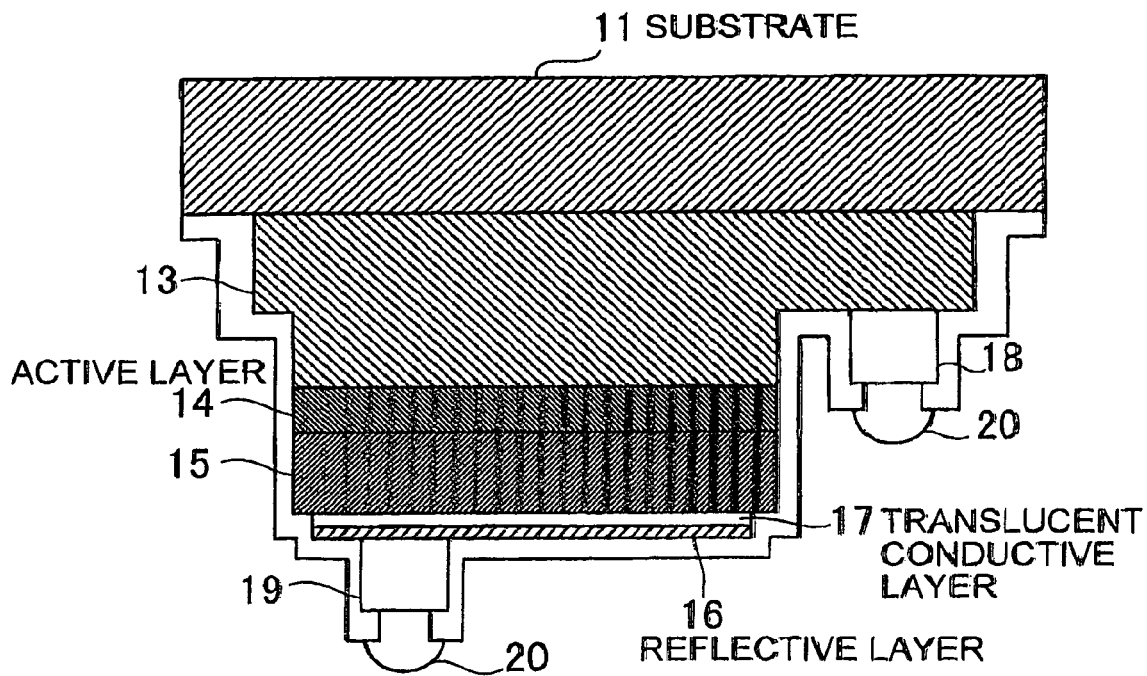
FIG. 11 is a schematic cross-sectional diagram showing a nitride semiconductor light emitting element according to Embodiment 2 of the present invention.

In addition, as for the configuration of the layers other than the conductive oxide film, the same configuration as in the above described embodiment 1 can be appropriately utilized. FIG. 11 shows a schematic cross-sectional view of the nitride semiconductor light emitting element according to Embodiment 2. The nitride semiconductor light emitting element shown in this figure is shown upside down in order to illustrate that it is mounted as a flip chip. In the actual manufacturing process the respective layers are formed on substrate 11, and the gained nitride semiconductor light emitting element is turned upside down before being mounted, as shown in FIG. 2. The same symbols are attached to the same structures, members and the like as in Embodiment 1, of which the detailed descriptions are omitted.

In addition to this, unevenness is formed on th conductive oxide film shown in Embodiment 1, and thereby, the same properties as the semiconductor element of Embodiment 2, where the trace element D has a specific distribution of concentration in the direction of the film thickness, can be improved. Concretely speaking, it is preferable for the concentration of the trace element D to be different in the respective surfaces between surfaces of recesses and surfaces of protrusions, as well as between inclined surfaces that make contact with recesses and surfaces that make contact with protrusions. In a concrete example where the concentration of the trace element D in the vicinity of the surface that faces the interface between the conductive oxide film and the semiconductor layer becomes lower as the distance from the semiconductor layer becomes greater in the conductive oxide film, the concentration of the trace element D on the surfaces of recesses is higher than that on the surfaces of protrusions. That is to say, the concentration of the trace element D is low on the surfaces of protrusions forming surfaces with appropriate crystallinity and having appropriate reflection properties, and at the same time, the concentration of the trace element D is high in the surfaces of protrusions having a large amount of carriers and making appropriate ohmic contact between the reflective layer and the conductive oxide film. In addition, these properties both exist in inclined surfaces, which is most preferable from the point of view of achieving an increase in the amount of light emission to the outside and a decrease in the operation voltage.

Two embodiments are shown in the above, and both semiconductor elements are described as light emitting elements made of a nitride semiconductor. In addition, though the first conductivity type is n-type and the second conductivity type is p-type, concerning the semiconductor layers shown in the preferred embodiments, the present invention is not limited to these, but rather, semiconductor elements provided with characteristics of the present invention are, of course, included in the present invention.

EXAMPLE 1

In the following, the examples according to the present invention are described in detail. Here, as Example 1, an LED which is a semiconductor light emitting element having the configuration shown in FIG. 3 is fabricated. First, an MOVPE reactive unit is used and a buffer layer made of GaN is grown in sequence so as to have a film thickness of 200 Angstroms, an n-type contact layer made of an Si doped n-type GaN is grown so as to have a film thickness of 4 μm, an active layer 14 having a single quantum well structure made of non-doped $In_{0.2}Ga_{0.8}N$ so as to have a film thickness of 30 Angstroms, a p-type clad layer made of an Mg doped p-type $Al_{0.1}Ga_{0.9}N$ so as to have a film thickness of 0.2 μm, and a p-type contact layer made of an Mg doped p-type GaN so as to have a film thickness of 0.5 μm, on a sapphire substrate 11 having a diameter of 2 inches.

Furthermore, annealing is carried out on the wafer in a reactor chamber in a nitrogen atmosphere at a temperature of 600° C., so that the resistance of p-type nitride semiconductor layer 15 is further reduced. After the annealing, the wafer is taken out of the reactor chamber and a mask of a predetermined form is formed on the surface of the p-type GaN, which is the top layer, and then, etching is carried out through the mask in an etching unit so that the n-type contact layer is partially exposed, as shown in FIG. 3.

Next, the mask on p-type nitride semiconductor layer 15 is removed, and ITO is sputtered and deposited on approximately the entire surface of p-type GaN, which is the top layer, as translucent conductive layer 17 so as to have a film thickness of 4000 Å. Translucent conductive layer 17 after sputtering is clearly translucent, and sapphire substrate 11 can be seen through when observed. As described above, translucent conductive layer 17 is formed on approximately the entire surface of the exposed p-type nitride semiconductor layer 15, and thereby, it becomes possible to uniformly spread the current to the entirety of p-type nitride semiconductor layer 15. In addition, since translucent conductive layer 17 is translucent, the electrode side can be used as the main light emitting surface. After the formation of translucent conductive layer 17 made of ITO, unevenness is formed on ITO by means of RIE (reactive ion etching). After the formation of unevenness, further sputtering is carried out and a film of Rh is formed as reflective layer 16 so as to have a film thickness of 1000 Å. Here, film formations of translucent conductive layer 17 (ITO) and reflective layer 16 (Rh) are both carried out in an Ar atmosphere with a power as low as 100 W. At the point in time when translucent conductive layer 17 is formed, oxygen is not sufficient in ITO, which has low translucency. In addition, the patterning translucent conductive layer 17 (ITO) and reflective layer 16 (Rh) is carried out by means of wet etching. As described above wet etching is carried out in order to reduce the contact resistance in the interface.

Here, a film of ITO may be formed in the condition of being heated to approximately 300° C. during film formation by means of sputtering; the film may be formed at room temperature during sputtering, and heat treatment may be carried out after the film formation; or these two methods may be combined. The contact after heat treatment exhibits appropriate ohmic properties. In addition, the gained translucent conductive layer 17 includes an ITO film of which the sheet resistance is low in comparison with that of the prior art. According to the above described process, translucent conductive layer 17 having a sheet resistance as low as 6.5 O/ and a transmission as high as approximately 90% can be gained.

After the formation of reflective layer 16, a pad electrode that includes Pt/Au is formed throughout the entire surface of reflective layer 16 so as to have a film thickness of 7000 Å. Here, this pad electrode is not translucent.

After the formation of the pad electrode, an n electrode that includes Ti/Rh/Pt/Au is formed on the exposed n-type nitride semiconductor layer 13 so as to have a film thickness of 7000 Å.

The wafer where electrodes are formed on the n-type contact layers and p-type contact layers as described above is cut into square chips of which the sides are 320 μm, and then, each chip is mounted on sub-mount 10 as a flip chip, as shown in FIG. 2.

EXAMPLE 2

An LED is fabricated as Example 5 by making reflective layer 16 of a dielectric with other portions the same as in the above described Example 1. Reflective layer 16 is formed of nine layers, which is 4.5 pairs of $TiO_2/SiO_2$, on translucent conductive layer 17. The film thickness may have a value which is integer times as large as λ/4 when the peak wavelength of light emitted from the light emitting layer is λ, and here, λ/4 (nm) is used. A layer having a large index of refraction, is placed in reflective layer 16 on the side into which light enters, that is to say on the side close to translucent conductive layer 17, and thereby, it is made easy for total reflection to occur, and reflectance can be increased. A multilayered film is made of dielectrics as described above, where pairs of a layer having a large index of refraction and a layer having a small index of refraction are repeated, increasing the critical angle on the surface, and thereby, the amount of light that is reflected can be increased. The reflectance has increased by 140% from example 1, by utilizing this reflection layer 16 where dielectrics are layered.

EXAMPLE 3

Figure 12:
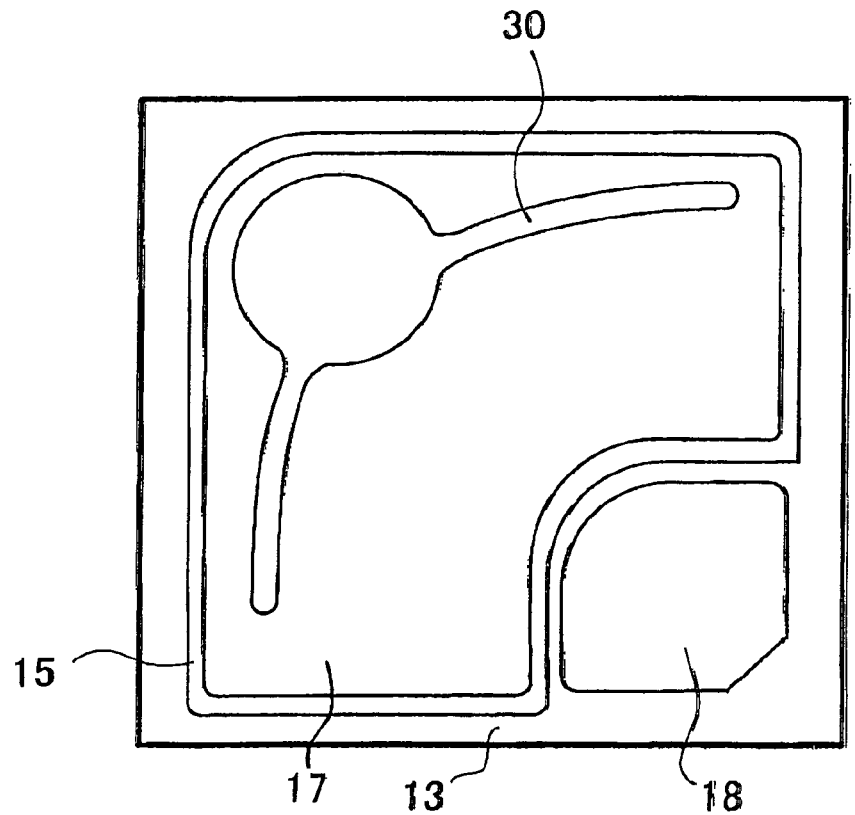
FIG. 12 is a schematic diagram showing the surface of a translucent conductive layer in a nitride semiconductor light emitting element according to another embodiment of the present invention.

In Example 3, an auxiliary electrode 30 that extends in arc form toward the outer periphery adjacent to LED chips from the corner opposite to the n electrode is formed as shown in FIG. 12, between translucent conductive layer 17 and reflective layer 16 of the above described Example 2. Such an auxiliary electrode 30 diffuses current that is injected into the semiconductor light emitting element throughout the entirety of the translucent electrode. Auxiliary electrode 30 is formed of materials Rh/Pt/Au in a manner where the respective film thicknesses are 1000 Angstroms/2000 Angstroms/5000 Angstroms. Metal (Rh) that also functions as a reflective layer is formed, and therefore, the reflection efficiency is barely lowered and auxiliary electrode 30 can be used as a preferable electrode. A semiconductor light emitting element with other portions the same as in Example 2 is fabricated, and an element of which $V_f$ is still lower than that of example 2 can be gained.

EXAMPLE 4

In Example 4, 19 layers of dielectric materials, which is 9.5 pairs, of $ZrO_2/SiO_2$, are layered as a reflective layer, instead of the reflective layer in the above described Example 2. The film thickness is adjusted to $\lambda/4$ (nm) when the peak wavelength of light emitted from the light emitting layer is $\lambda$. The multilayered film made of combinations of $ZrO_2$ and $SiO_2$ has a difference in the indexes of refraction which is smaller than that of the multilayered film made of combinations of $TiO_2$ and $SiO_2$, and therefore, the number of layers has been increased. A semiconductor light emitting element with other portions the same as in Example 2 is fabricated and an element having the same characteristics as in Example 2 is gained.

EXAMPLE 5

In Example 5, an n electrode is made of ITO/Rh/Pt/Au instead of the n electrode that includes Ti/Rh/Pt/Au in the above described Example 1 so as to have the same configuration of the p electrode (translucent conductive layer/reflective layer/pad electrode) formed on the p-type layer, and the n electrode is formed at the same time as the p electrode. This configuration allows the electrode formation process to be simplified and light from the light emitting layer that has propagated inside the semiconductor light emitting element and has hit the n electrode to be appropriately reflected, increasing the light emitting efficiency in comparison with Example 1.

EXAMPLE 6

In Example 6, an n electrode is formed of ITO/(19 layers, which is 9.5 pairs, made of $ZrO_2/SiO_2$)/Pt/Au instead of the n electrode that includes Ti/Rh/Pt/Au in the above described Example 4 so as to have the same configuration as the p electrode (translucent conductive layer/reflective layer/pad electrode) formed on the p-type layer, and the n electrode is formed at the same time as the p electrode. This configuration allows the electrode formation process to be simplified, and light from the light emitting layer that has propagated inside the semiconductor light emitting element and has hit then electrode to be appropriately reflected, increasing the light emitting efficiency in comparison with Example 4.

EXAMPLE 7

Next, Example 7 is described in detail. An LED is fabricated as a semiconductor light emitting element having the configuration shown in FIG. 3. First, an MOVPE reactive unit is used and a buffer layer (of which the film thickness is approximately 100 Å) made of AlGaN; an undoped GaN layer (1 µm); an n-type contact layer (5 µm) that forms an n electrode made of GaN that includes $4.5 \times 10^{18}/cm^3$ of Si; an n-side first multilayered film layer (of which the total film thickness is 3350 Å) made of three layers a lower layer (3000 Å) made of undoped GaN, an intermediate layer (300 Å) made of GaN that includes $4.5 \times 10^{18}/cm^3$ of Si, and an upper layer (50 Å) made of undoped GaN; an n-side second multilayered film layer (of which the total film thickness is 640 Å) having a super-lattice structure where ten layers of undoped GaN (40 Å) and ten layers of undoped $In_{0.1}Ga_{0.9}N$ (20 Å) are alternately layered in a repetitive manner, and undoped GaN (40 Å) is further layered on the top; a light emitting layer (of which the total film thickness is 1930 Å) having a multiple quantum well structure where six barrier layers (250 Å) made of undoped GaN, six well layers (30 Å) made of $In_{0.3}Ga_{0.9}N$, six first barrier layers (100 Å) made of $In_{0.02}Ga_{0.98}N$, and six second barrier layers (150 Å) made of undoped GaN are alternately layered in a repetitive manner; a p-side multi-layered film layer (of which the total film thickness is 365 Å) having a super-lattice structure where five layers of $Al_{0.15}Ga_{0.85}N$ (40 Å) that includes $5 \times 10^{19}/cm^3$ of Mg, and five layers of $In_{0.03}Ga_{0.97}N$ (25 Å) that includes $5 \times 10^{10}/cm^3$ of Mg are alternately layered in a repetitive manner, and $Al_{0.15}Ga_{0.85}N$ (40 Å) that includes $5 \times 10^{19}/cm^3$ of Mg is additionally layered on the top; and a p-type contact layer (1200 Å) wherein a p electrode is formed on the surface made GaN that includes $1 \times 10^{20}/cm^3$ of Mg, are grown in sequence on a sapphire substrate 11 having a diameter of two inches. Here, the lower layer (3000 Å) made of undoped GaN has a three-layered structure formed of a first layer (1500 Å) made of undoped GaN, a second layer (100 Å) made of GaN that includes $5 \times 10^{17}/cm^3$ of Si, and a third layer (1500 Å) made of undoped GaN, starting from the bottom, and undoped GaN (2000 Å) is formed between the p-side multilayered film layer and the p-side contact layer, and after that, a p-type semiconductor layer exhibiting p-type because of the diffusion of Mg from the adjoining layers is formed.

Furthermore, annealing is carried out on the wafer in a reactive chamber in a nitrogen atmosphere at a temperature of 600° C. so as to further reduce the resistance of p-type nitride semiconductor layer 15. After the annealing, the wafer is taken out of the reactive chamber, and a mask of a predetermined form is formed on the surface of p-type GaN, which is the top layer, so that etching is carried out through the mask in an etching unit, and then, the n-type contact layer is partially exposed, as shown in FIG. 3.

Next, the mask on p-type nitride semiconductor layer 15 is removed, and ITO is sputtered and deposited on approximately the entire surface of p-type GaN, which is the top layer, as translucent conductive layer 17 so as to have a film thickness of 4000 Å. Translucent conductive layer 17 after sputtering is clearly translucent, and sapphire substrate 11 can be seen through when observed. As described above, translucent conductive layer 17 is formed on approximately the entire surface of the exposed p-type nitride semiconductor layer 15, and thereby, it becomes possible to uniformly spread the current to the entirety of p-type nitride semiconductor layer 115. In addition, since translucent conductive layer 17 is translucent, the electrode side can be used as the main light emitting surface. After the formation of translucent conductive layer 17 made of ITO, sputtering is carried out and a film of Rh is formed as reflective layer 16 so as to have a film thickness of 1000 Å. Here, film formations of translucent conductive Layer 17 (ITO) and reflective layer 16 (Rh) are both carried out in an Ar atmosphere with a power as low as 100 W. In addition, the patterning translucent conductive layer 17 (ITO) and reflective layer 16 (Rh) is carried out by means of wet etching. As described above, wet etching is carried out in order to reduce the contact resistance in the interface.

Here, though a film of ITO may be formed in the condition of being heated to approximately 300° C. during film formation by means of sputtering, or the film may be formed at room temperature during sputtering, and heat treatment in may be carried out after the film formation, in the present example, heat treatment is carried out in a manner where the concentration of tin in ITO in the proximity of the interface vis-à-vis the p-type contact layer becomes higher than that of tin in other portions of ITO. As a result of measurement of tin in ITO in the direction of the film thickness by means of an AES unit, as shown in FIG. 10(a), it is confirmed that the concentration of tin is high in the proximity of the interface vis-à-vis the semiconductor layer. As a result of the above described process, translucent conductive layer 17 having a high translucency and a low resistance can be gained.

After the formation of reflective Layer 16, Ti/Rh/Pt/Au is formed throughout the entirety of the surface of reflective layer 16 and on the exposed n-type nitride semiconductor layer 13 so as to have a film thickness of 7000 Å.

The wafer where electrodes are formed on the n-type contact layers and p-type contact layers as described above is cut into square chips of which the sides are 320 µm, and than, each chip is mounted on sub-mount 10 as a flip chip, as shown in FIG. 2. Thus, an element of which the light emitting efficiency to the outside has been increased and of which the operation voltage has been reduced in comparison with the case where a conventional ITO is used can be gained.

EXAMPLE 8

Figure 13:
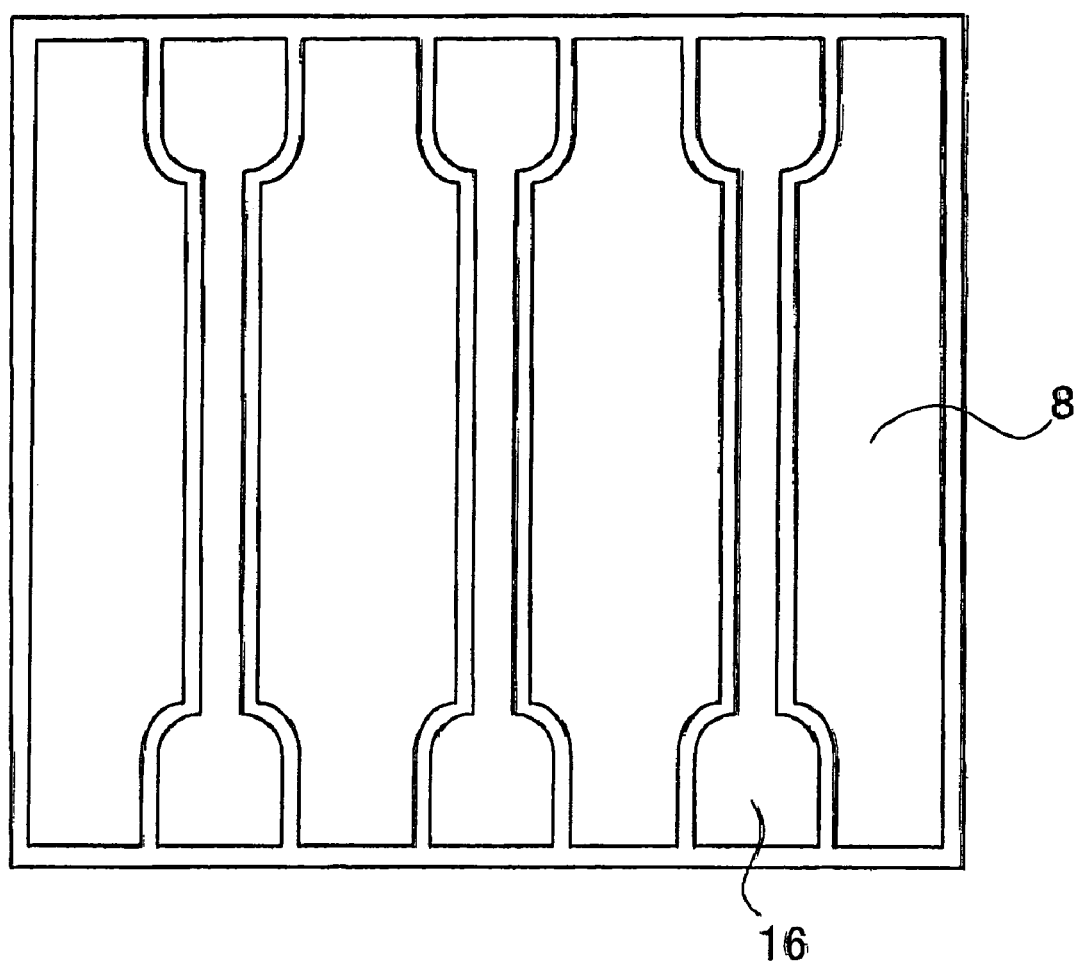
FIG. 13 is a schematic diagram showing the form of an electrode in a nitride semiconductor light emitting element according to another embodiment of the present invention.

Next, Example 8 is described in reference to FIG. 13, which is a plan diagram showing the electrode formation surface. In the semiconductor element according to Example 8, as shown in FIG. 13, the n-type nitride semiconductor layer is exposed in stripes between the p-type nitride semiconductor layer portions by means of etching. Each portion of the exposed n-type nitride semiconductor layer has a form that is narrowed inside the element, and an n electrode 8 is formed on this exposed n-type semiconductor layer. Here, p-side translucent conductive layer (ITO) 17 and reflective layer (Rh) 16 are in stripes, and each stripe has a form where the width in the center portion of the light emitting element is greater than that of the exposed n-type nitride semiconductor layer. The p-side translucent conductive layer is formed of ITO, which is the same as in Example 7. The number of stripes of p-side translucent conductive layer 17 and reflective layer 16 is greater than the number of columns; of n electrode (Ti/Rh/Pt/Au) 8 on the n-type nitride semiconductor layer. Thus, a semiconductor light emitting element with other portions the same as in Example 7 is gained. Here, in FIG. 13, reflective layer 16 is formed on translucent conductive layer 17, and therefore, only reflective layer 16 can be seen in the plan diagram.

As described above, the n electrode is shaped in a constricted form, and thereby, the area of the regions of the p-side translucent conductive layer and the reflective layer can be increased so that the amount of current injected into the light emitting element per hour unit can be increased. Furthermore, the area of the portions of the n-type nitride semiconductor layer which do not contribute to the light emission of the light emitting element can be reduced in the light emitting surface, and the area of the p-type nitride semiconductor layer can be relatively increased, and thereby, the light emitting efficiency of the light emitting element can be increased Accordingly, high brightness can be implemented in this light emitting element. In addition, the translucent conductive layer is provided as described above, and thereby, the current that is injected into the light emitting element can be diffused uniformly throughout the entire surface of the light emitting element, and thus, light emission from the light emitting surface of the light emitting element can be made uniform.

Here, it is preferable for the pad electrode and the n electrode which are formed on the reflective layer on the p-side to contain at least one of material which is container in the bump. In the case where the material of the bump is Au, for example, it is preferable for the material of the pad electrode and the n electrode on the p-side, in particular, the material of the joining surface that makes direct contact with the bump to be Au or an alloy that includes Au. In addition, the pad and the n electrode may be a single layer or a multilayered film of Ag, Al, Rh or Rh/Ir.

EXAMPLE 9

Furthermore, the semiconductor light emitting element according to Example 9 is gained by forming unevenness in the same manner as in Example 1 on the surface of the translucent conductive layer of the same light emitting element as that gained in the above described Example 7, and then, a reflective layer is formed on this unevenness, with other portions the same as in Example 7. In the semiconductor light emitting element gained in this manner, the light emitting efficiency to the outside is further increased, and the operation voltage is further reduced.

EXAMPLE 10

Furthermore, the semiconductor element according to Example 10 is described below. In this semiconductor element also, the n-type nitride semiconductor layer is exposed in stripes between the p-type nitride semiconductor layer portions by means of etching, as shown in the plan diagram of FIG. 13 showing the surface on which electrodes are formed. Each portion of the exposed n-type nitride semiconductor layer has a form which becomes narrow inside of the element, and the n electrode is formed on this exposed n-type semiconductor layer. Here, the translucent conductive layer (ITO) and the reflective layer (Rh) on the p-side are in stripes, and each stripe has a form where the width in the center portion of the light emitting element is greater than that of the exposed n-type nitride semiconductor layer. The translucent conductive layer on the p-side is formed of ITO, which is the same as in the above described Example 7. The number of stripes of the translucent conductive layer and the reflective layer on the p-side is greater than the number of columns of then electrode (Ti/Rh/Pt/Au) on then-type nitride semiconductor layer. Thus, a semiconductor light emitting element with other portions the same as in the above described example 9 is gained.

As described above, portions of the n electrode have a form which is narrow in the middle, and thereby, the area of the regions of the p-side translucent conductive layer and the reflective layer can be increased so that the amount of current injected into the light emitting element per hour unit can be increased. Furthermore, the area of the portions of the n-type nitride semiconductor layer which do not contribute to the light emission of the light emitting element can be reduced in the light emitting surface, and the area of the p-type nitride semiconductor layer can be relatively increased, and thereby, the light emitting efficiency of the light emitting element can be increased. Accordingly, high brightness can be implemented in this light emitting element. In addition, the translucent conductive layer is provided as described above, and thereby, the current that is injected into the light emitting element can be diffused uniformly throughout the entire surface of the light emitting element, and thus, light emission from the light emitting surface of the light emitting element can be made uniform.

Here, it is preferable for the pad electrode and the n electrode which are formed on the reflective layer on the p-side to contain at least one of material which is contained in the bump. In the case where the material of the bump is Au, for example, it is preferable for the material of the pad electrode and the n electrode on the p-side, in particular, the material of the joining surface that makes direct contact with the bump to be Au or an alloy that includes Au. In addition, the pad and the n electrode may be a single layer or a multilayered film of Ag, Al, Rh or Rh/Ir.

As described above, a nitride semiconductor light emitting element in any of the examples shown starting from Example 1 is formed on a mount substrate as a flip chip, and thereby, more than one nitride semiconductor light emitting element can be mounted at equal potentials, and a high degree of miniaturization of a nitride semiconductor light emitting device can be achieved in comparison with the case where chips are mounted face-up. In particular, while the pad electrode becomes a light blocking portion, reducing the light emitting area, in the case of face-up mounting, the entire surface on the rear side of substrate 11 can be used as the light emitting surface, making light emission from a large are possible in the case of flip chip mounting. In addition, a eutectic alloy is used in the joint, and thereby a comparatively large light emitting area can be secured, even when the device is miniaturized. In addition the film thicknesses of translucent conductive layer 17 and reflective layer 16 can be adjusted, making it easy to provide a horizontal light emitting surface of the element or to make the light emitting surface of the element incline from the horizon.

A semiconductor element of the present invention can be applied as a light receiving element, in addition to a light emitting element, and can be applied to an LED device such as a full color LED display, an LED traffic light or a display board for traffic information, as a light emitting diode (LED) or a laser diode (LD), for example, or to an image scanner or the like, as a light receiving element such as a solar battery or a light sensor. Alternatively, a semiconductor element of the present invention can be appropriately utilized for an electronic device (a transistor such as FET, or a power device), a light source for a medium such as a DVD for storing a large capacity of information, such as a light source for an optical disc, a light source for communication, a printing apparatus, a light source for illumination and the like.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the metes and bounds of the claims or equivalence of such metes and bounds thereof are therefore intended to be embraced by the claims. This application is based on applications No. 2003-388894 filed in Japan on Nov. 19, 2003, and PCT/JP2004/16957 filed in Japan on Nov. 15, 2004, the contents of which are incorporated hereinto by reference.

What is claimed is:

1. A semiconductor element, comprising:
a substrate having a pair of main surfaces that face each other;
a semiconductor layer of a first conductivity type on one of the main surfaces of said substrate;
a semiconductor layer of a second conductivity type on said semiconductor layer of the first conductivity type;
an active layer formed between said semiconductor layer of the first conductivity type and said semiconductor layer of the second conductivity type; and
a reflective layer formed on said semiconductor layer of the second conductivity type for reflecting light from said active layer toward said semiconductor layer of the second conductivity type,
wherein the other main surface of said substrate is used as the main light emitting surface,
wherein a translucent conductive layer is formed between said reflective layer and the semiconductor layer of the second conductivity type, and an uneven interface is formed as the interface between said translucent conductive layer and said reflective layer.

2. The semiconductor element according to claim 1 wherein the interface between said translucent conductive layer and said semiconductor layer of the second conductivity type is an approximately flat and smooth surface.

3. The semiconductor element according to claim 1, wherein said uneven surface is provided with inclined surfaces of which the angle of inclination is not greater than 60° relative to the normal line to the main light emitting surface.

4. The semiconductor element according to claim 1, wherein said uneven surface is in the form of continuous cylindrical lenses.

5. The semiconductor element according to claim 1, wherein said translucent conductive layer is an oxide film that includes at least one of element C selected from a group consisting of at least zinc, indium, tin and magnesium.

6. The semiconductor element according to claim 5, wherein said oxide film includes a trace element D in addition to element C.

7. The semiconductor element according to claim 6, wherein said trace element D is at least one of element selected from among tin, zinc, gallium and aluminum.

8. The semiconductor element according to claim 7, wherein the concentration of said trace element D in the vicinity of the interface between said semiconductor layer and said oxide film is higher than that of the trace element D in the other portion of the film in said oxide film.

9. The semiconductor element according to claim 7, wherein the concentration of said trace element D in the vicinity of the interface between said semiconductor layer and said oxide film is higher than that of said trace element D in the vicinity of the surface opposite to said interface.

10. The semiconductor element according to claim 6, wherein said oxide film includes element D of which the amount is not greater than 20% of the amount of element C.

11. The semiconductor element according to claim 1, wherein said translucent conductive layer is made of ITO.

12. The semiconductor element according to claim 1 wherein said reflective layer includes at least one of element selected from among aluminum, titanium, platinum, rhodium, silver, palladium, iridium, silicon and zinc.

13. The semiconductor element according to claim 1, wherein said reflective layer is a metal film that includes aluminum.

14. The semiconductor element according to claim 1, wherein said reflective layer is made of a dielectric that includes at least any of Si, Zn and Ti.

15. The semiconductor element according to claim 1, wherein the film thickness of said transluent conductive layer is approximately integer times of $\lambda/4$, wherein the wavelength of light emitted from said active layer is $\lambda$.

16. The semiconductor element according to claim 1, wherein the film thickness of said translucent conductive layer is not greater than 1 μm.

17. The semiconductor element according to claim 1 wherein said reflective layer is also formed in a plane that crosses the main surfaces of substrate.

18. The semiconductor element according to claim 1, wherein at least a portion of the surface of said semiconductor layer that crosses the main surfaces of said substrate is: inclined.

19. The semiconductor element according to claim 1, wherein said semiconductor layer of the first conductivity type is an n-type semiconductor layer and the semiconductor layer of the second conductivity type is a p-type semiconductor layer.

20. The semiconductor element according to claim 1, wherein said semiconductor layer of the first conductivity type and the semiconductor layer of the second conductivity type are nitride semiconductor layers.

* * * * *